US010748627B2

(12) United States Patent
Chen et al.

(10) Patent No.: US 10,748,627 B2
(45) Date of Patent: Aug. 18, 2020

(54) REDUCING NEIGHBOR WORD LINE INTERFERENCE IN A TWO-TIER MEMORY DEVICE BY MODIFYING WORD LINE PROGRAMMING ORDER

(71) Applicant: SanDisk Technologies LLC, Addison, TX (US)

(72) Inventors: Hong-Yan Chen, San Jose, CA (US); Yingda Dong, Los Altos, CA (US); Zhengyi Zhang, Mountain View, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/229,639

(22) Filed: Dec. 21, 2018

(65) Prior Publication Data

US 2020/0202962 A1 Jun. 25, 2020

(51) Int. Cl.
*G11C 16/04* (2006.01)
*G11C 16/34* (2006.01)
(Continued)

(52) U.S. Cl.
CPC ...... *G11C 16/3427* (2013.01); *G11C 11/5628* (2013.01); *G11C 11/5671* (2013.01);
(Continued)

(58) Field of Classification Search
CPC . G11C 16/3427; G11C 16/10; G11C 16/0483; G11C 11/5671; G11C 11/5628;
(Continued)

(56) References Cited

U.S. PATENT DOCUMENTS 7,808,822 B2   10/2010 Han
7,952,927 B2 *  5/2011 Aritome ............. G11C 16/0483
                                                365/185.11
(Continued)

FOREIGN PATENT DOCUMENTS

WO   WO2008/085254 A1   7/2008
WO   WO2014/197523 A1   12/2014

OTHER PUBLICATIONS

U.S. Appl. No. 15/879,084, filed Jan. 24, 2018, by Chen et al.
(Continued)

*Primary Examiner* — Tha-O H Bui
(74) *Attorney, Agent, or Firm* — Vierra Magen Marcus LLP

(57) ABSTRACT

Techniques for reducing neighbor word line interference (NWI) of memory cells which are formed in a two-tier stack having a lower tier and an upper tier separated by an interface. In one approach, an upward word line programming order is used for a top portion of the top tier, and a downward word line programming order is used for a bottom portion of the top tier and for the bottom tier. Additionally, for memory cells which receive NWI from both adjacent word lines, options include programming fewer bits per cell, performing multi-pass programming and/or use lower verify voltages. Options also include increasing a control gate length of the memory cells and increasing a height of a dielectric region adjacent to the memory cells.

20 Claims, 27 Drawing Sheets

(51) Int. Cl.
*G11C 16/10* (2006.01)
*G11C 11/56* (2006.01)
*H01L 27/11582* (2017.01)
*H01L 27/11524* (2017.01)
*H01L 27/1157* (2017.01)
*H01L 27/11556* (2017.01)

(52) U.S. Cl.
CPC .......... *G11C 16/0483* (2013.01); *G11C 16/10* (2013.01); *G11C 16/3459* (2013.01); *H01L 27/1157* (2013.01); *H01L 27/11524* (2013.01); *H01L 27/11556* (2013.01); *H01L 27/11582* (2013.01)

(58) Field of Classification Search
CPC .............. G11C 16/3459; H01L 27/1157; H01L 27/11556; H01L 27/11582; H01L 27/11524
USPC .................................................... 365/185.02
See application file for complete search history.

(56) References Cited

U.S. PATENT DOCUMENTS

| | | | |
|---|---|---|---|
| 8,045,383 B2* | 10/2011 | Sel .................... | G11C 16/3427 365/185.02 |
| 8,230,165 B2 | 7/2012 | Han | |
| 8,861,267 B2 | 10/2014 | Seol et al. | |
| 9,859,298 B1 | 1/2018 | Pang et al. | |
| 2012/0307561 A1* | 12/2012 | Joo .................... | G11C 16/0483 365/185.17 |
| 2015/0078090 A1 | 3/2015 | Rabkin et al. | |
| 2017/0256308 A1* | 9/2017 | Kang .................... | G11C 16/10 |

OTHER PUBLICATIONS

U.S. Appl. No. 16/015,612, filed Jun. 22, 2018, by Chen et al.
International Search Report & the Written Opinion of the International Searching Authority dated Dec. 6, 2019, International Application No. PCT/US2019/047978].

* cited by examiner

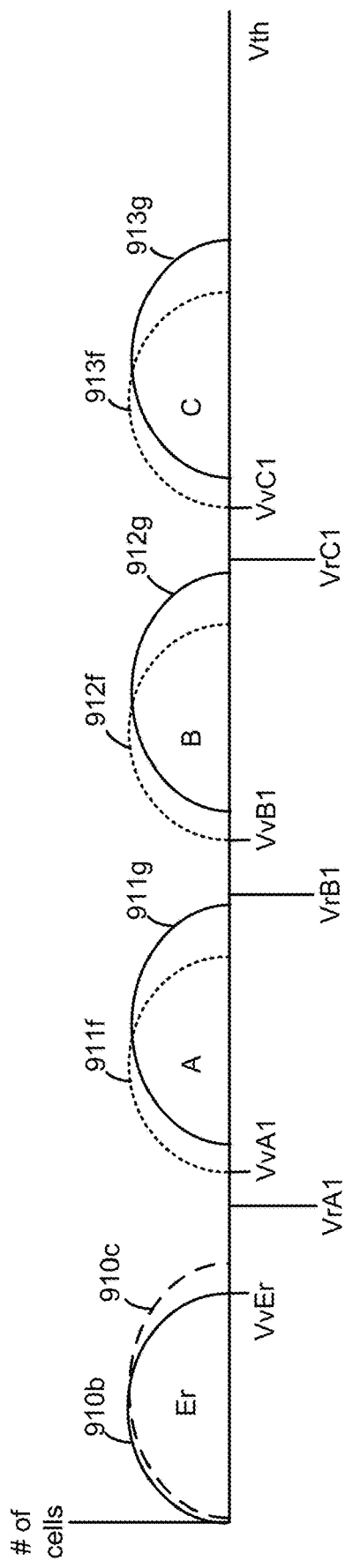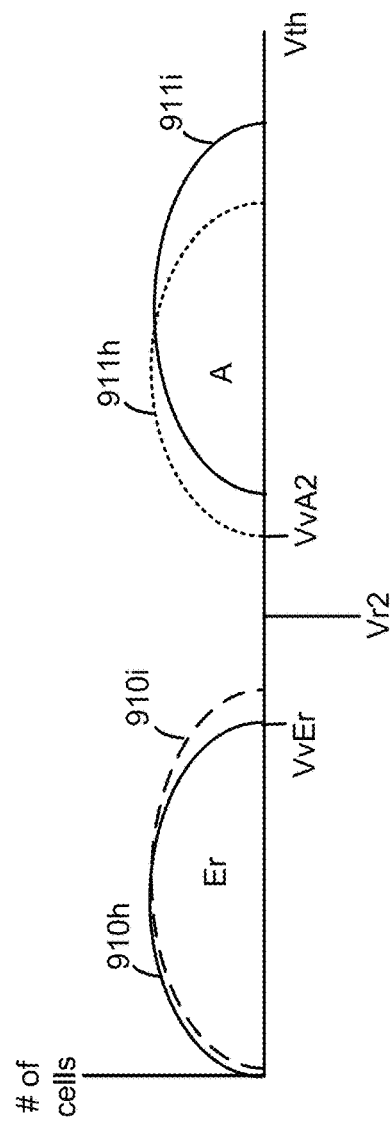

Vth width (downward WL programming order)

Vth width (upward WL programming order)

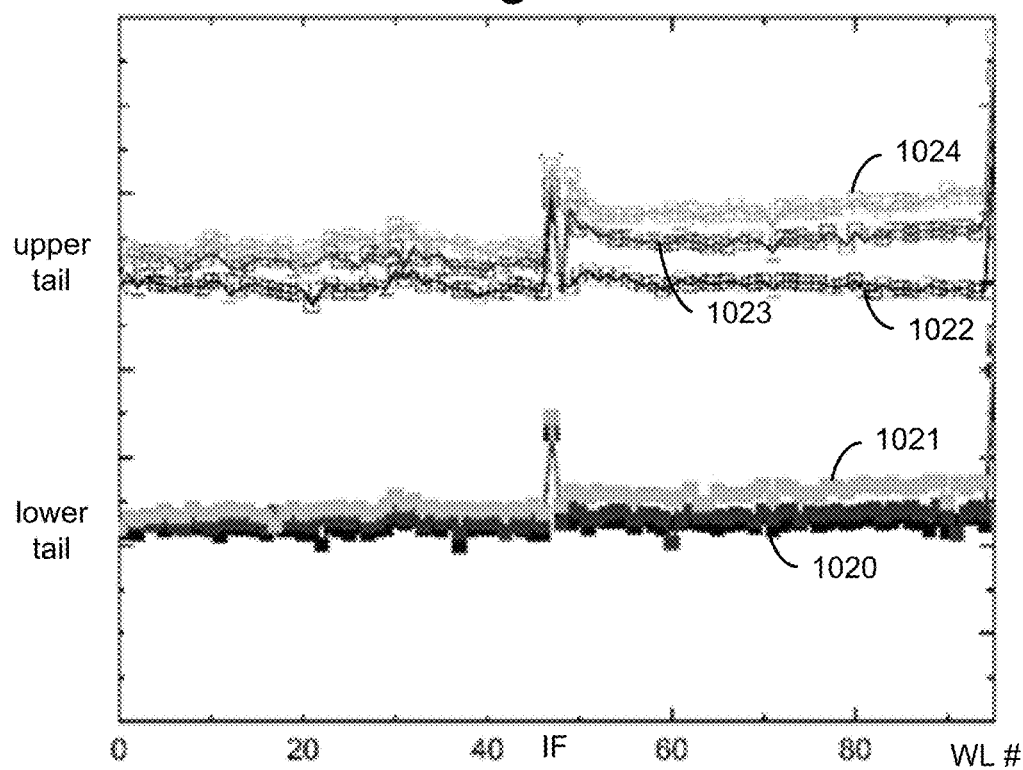
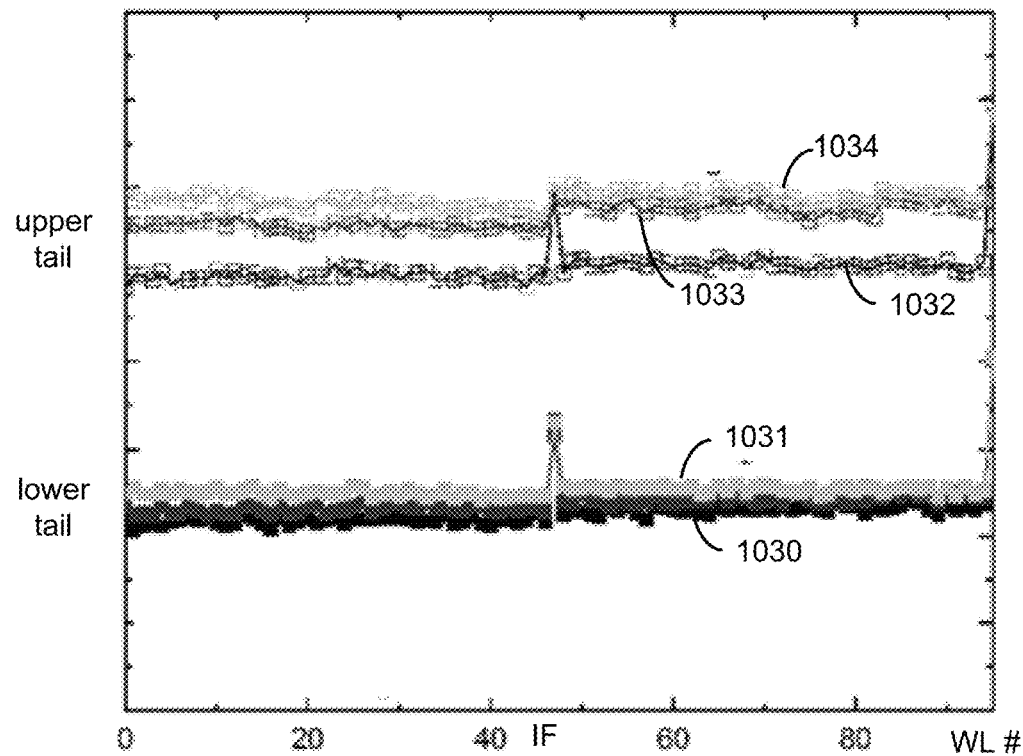

Increase in Vth due to
NWI (downward WL
programming order)

Increase in Vth due to
NWI (upward WL
programming order)

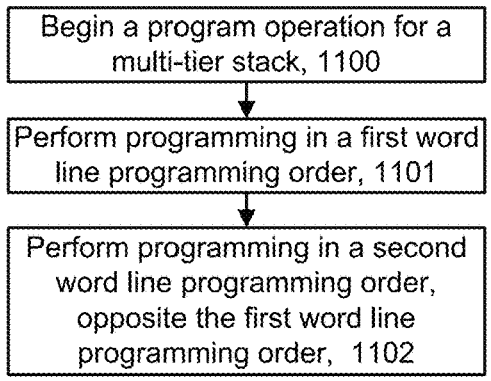
Fig. 11A
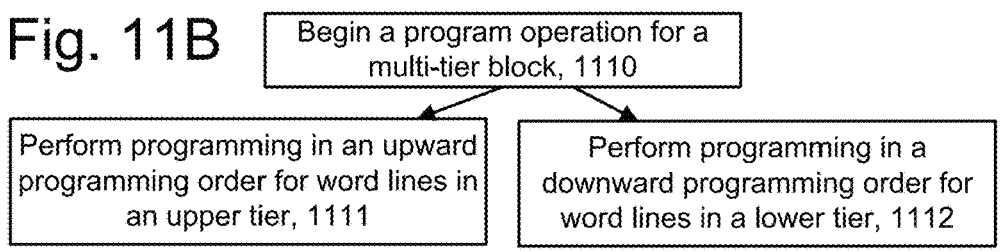
Fig. 11B
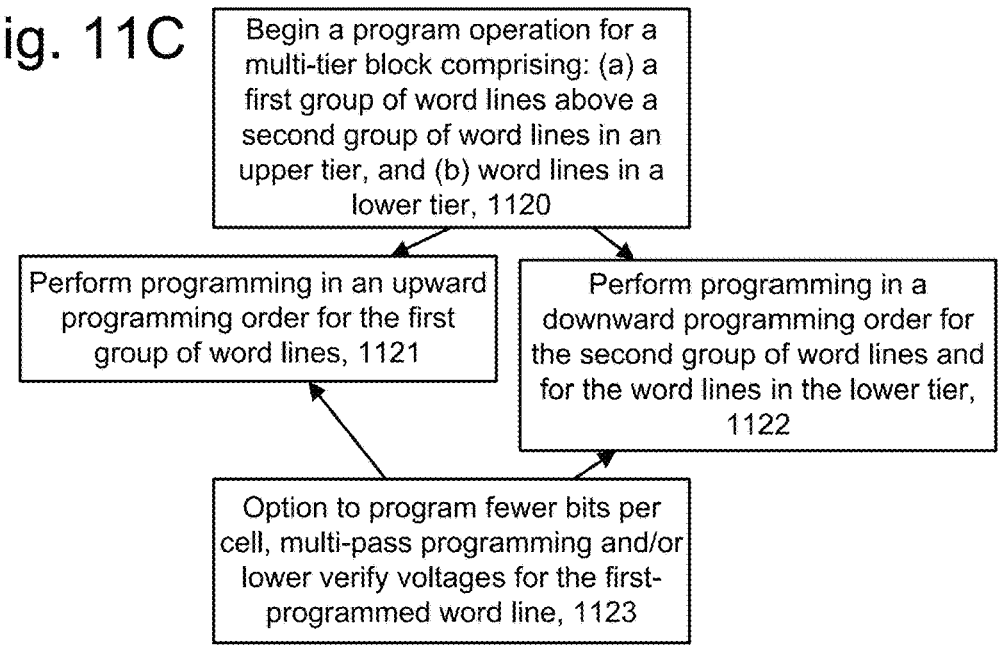
Fig. 11C
Fig. 11D
1. Program WLx+1 in first program pass
2. Program WLx+2 to WL95 in upward programming order
3. Program WLx to WL0 in downward programming order
4. Program WLx+1 in second program pass
Fig. 11E
1. Program WLx in first program pass
2. Program WLx-1 to WL0 in downward programming order
3. Program WLx+1 to WL95 in upward programming order
4. Program WLx in second program pass

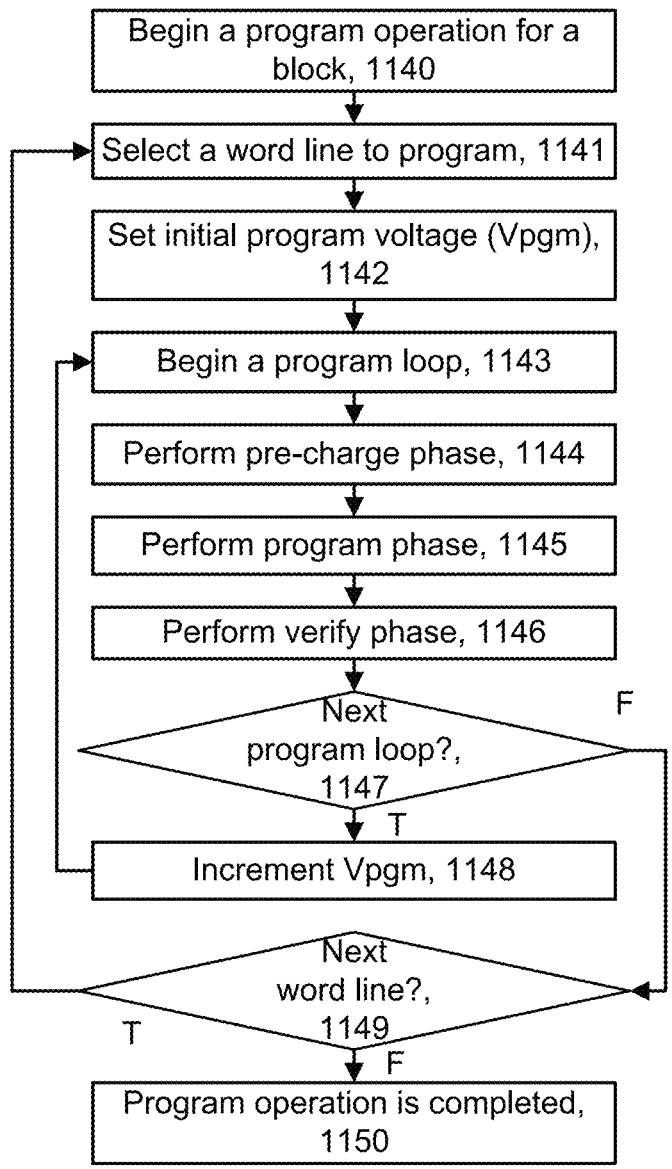

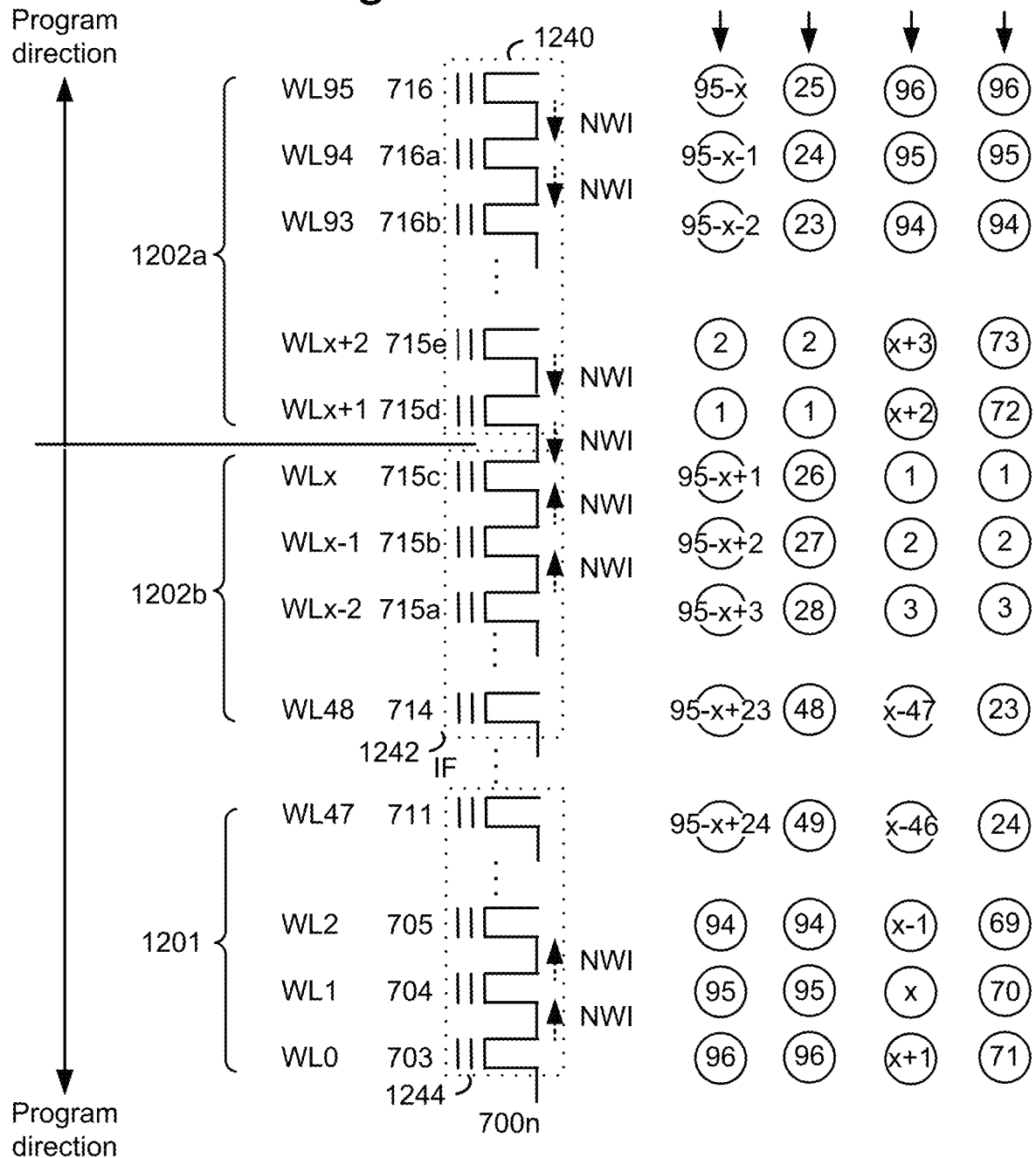

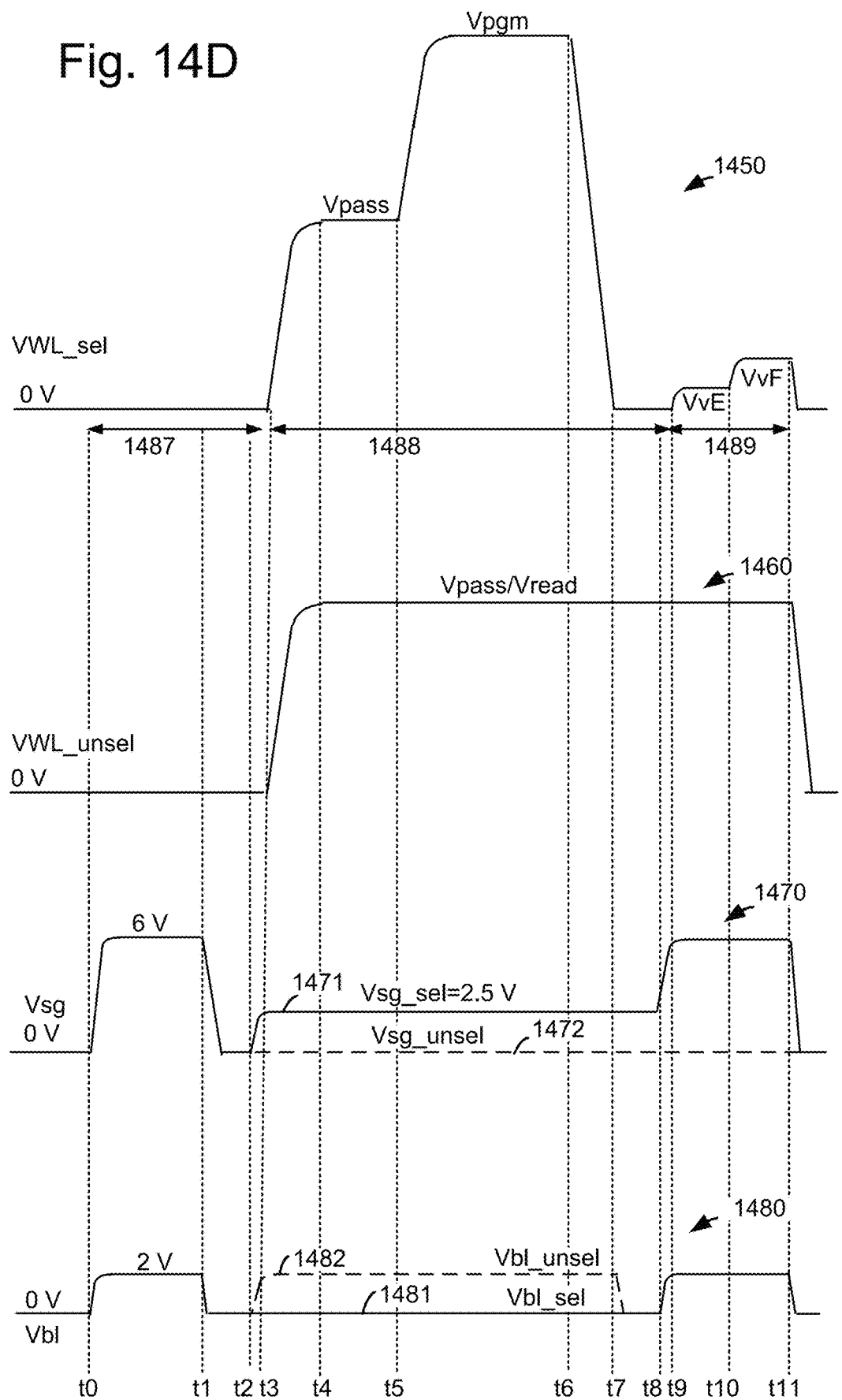

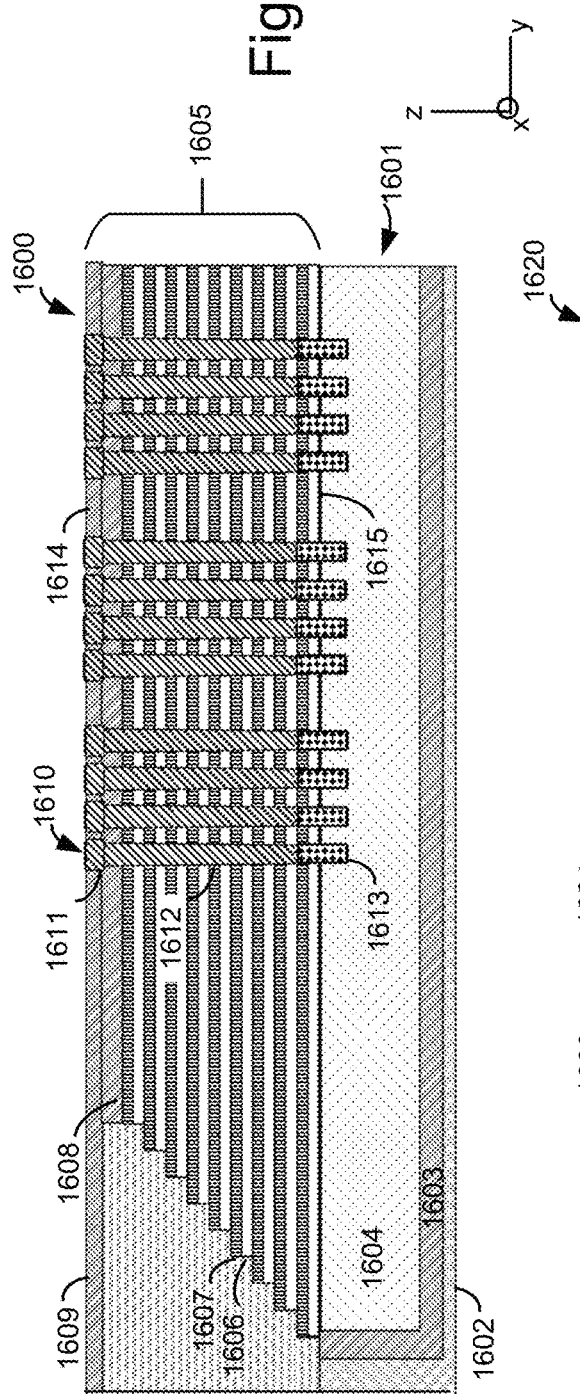
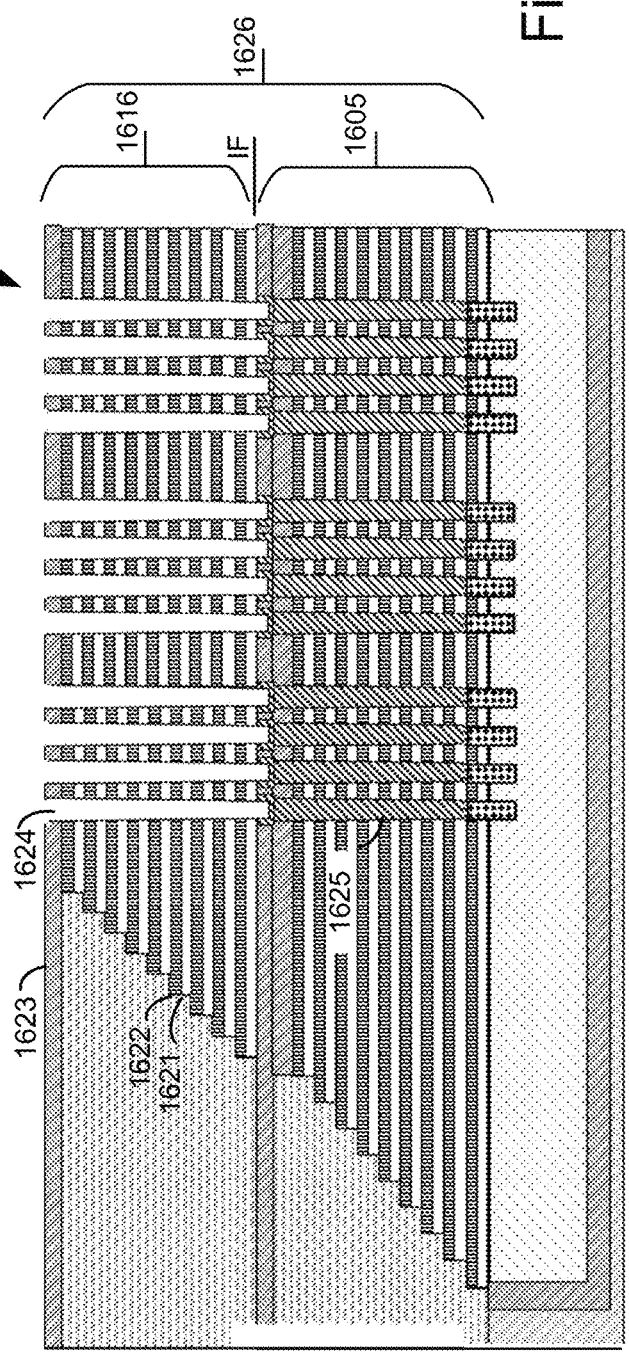
Fig. 16A
Fig. 16B

REDUCING NEIGHBOR WORD LINE INTERFERENCE IN A TWO-TIER MEMORY DEVICE BY MODIFYING WORD LINE PROGRAMMING ORDER

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in series, in NAND strings, for instance, where select gate transistors are provided at the ends of the NAND string to selectively connect a channel of the NAND string to a source line or bit line. However, various challenges are presented in operating such memory devices.

BRIEF DESCRIPTION OF THE DRAWINGS

FIG. 9D depicts an example Vth distribution of a set of MLC memory cells in four data states, with and without NWI.

FIG. 9E depicts an example Vth distribution of a set of SLC memory cells in two data states, with and without NWI.

FIG. 10C depicts a plot of upper and lower tail Vth versus a word line number with a downward programming order, consistent with FIG. 10A.

FIG. 10D depicts a plot of upper and lower tail Vth versus a word line number with an upward programming order, consistent with FIG. 10B.

FIG. 11A depicts a program process which reduces NWI in a multi-tier stack of memory cells.

FIG. 11B depicts an example implementation of FIG. 11A in which an upward programming order is used for word lines in an upper tier and a downward programming order is used for word lines in a lower tier.

FIG. 11C depicts an example implementation of FIG. 11A in which an upward programming order is used for a first group of word lines in an upper tier and a downward programming order is used for a second group of word lines in the upper tier and for the word lines in the lower tier.

FIG. 11D depicts an example implementation of step 1123 of FIG. 11C in which step 1121 occurs before step 1122 and multi-pass programming is used for the first-programmed word line, WLx+1, consistent with FIG. 9C.

FIG. 11E depicts an example implementation of step 1123 of FIG. 11C in which step 1122 occurs before step 1121 and multi-pass programming is used for the first-programmed word line, WLx, consistent with FIG. 9C.

FIG. 11F depicts an example programming operation for a selected word line, consistent with FIG. 11A.

FIG. 12C depicts a NAND string where an upward programming order is used for a first group of memory cells 1240 in an upper tier and a downward programming order is used for a second group of memory cells 1242 in the upper tier and for a set of memory cells 1244 in a lower tier, consistent with FIG. 11C.

FIG. 14D depicts examples of voltage signals which can be used in a program loop of a program operation, consistent with steps 1144-1146 of FIG. 11F.

FIG. 16A depicts a semiconductor structure in a configuration which is consistent with steps 1500 and 1501 of FIG. 15.

FIG. 16B depicts a semiconductor structure in a configuration which is consistent with steps 1502 and 1503 of FIG. 15.

DETAILED DESCRIPTION

Apparatuses and techniques are described for reducing neighbor word line interference in a memory device.

In some memory devices, memory cells are joined to one another such as in NAND strings in a block or sub-block. Each NAND string comprises a number of memory cells connected in series between one or more drain end select gate transistors (referred to as SGD transistors), on a drain end of the NAND string which is connected to a bit line, and one or more source end select gate transistors (referred to as SGS transistors), on a source end of the NAND string or other memory string or set of connected memory cells which is connected to a source line. Further, the memory cells can be arranged with a common control gate line (e.g., word line) which acts a control gate. A set of word lines extends from the source side of a block to the drain side of a block. Memory cells can be connected in other types of strings and in other ways as well.

In a 3D memory structure, the memory cells may be arranged in vertical NAND strings in a stack, where the stack comprises alternating conductive and dielectric layers. The conductive layers act as word lines which are connected to the memory cells. Each NAND string may have the shape of a pillar which intersects with the word lines to form the memory cells.

The memory cells can include data memory cells, which are eligible to store user data, and dummy or non-data memory cells which are ineligible to store user data. A dummy memory cell may have the same construction as a data memory cell but is considered by the controller to be ineligible to store any type of data including user data. A dummy word line is connected to a dummy memory cell. One or more dummy memory cells may be provided at the drain and/or source ends of a string of memory cells to provide a gradual transition in the channel voltage gradient.

Figure 14A:
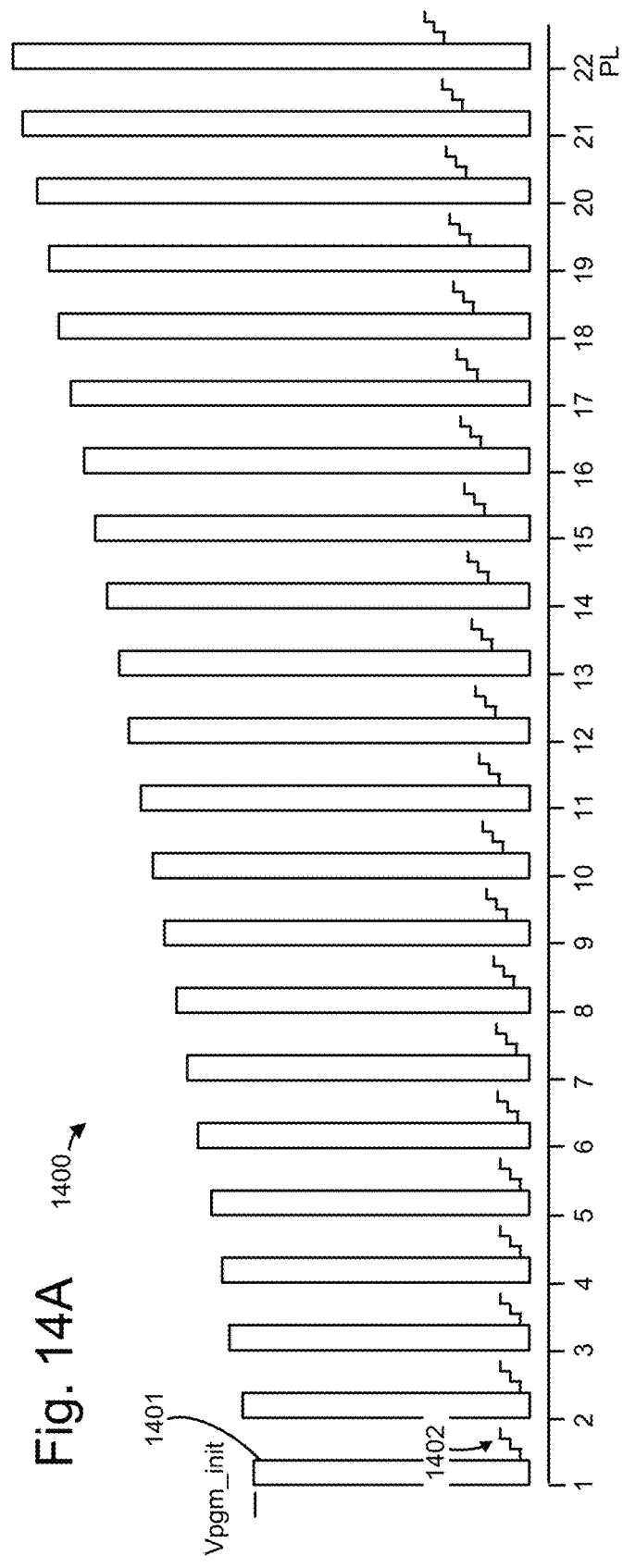
FIG. 14A depicts a voltage signal used in a series of program loops in an example program operation for MLC memory cells consistent with FIG. 11F.

During a programming operation, the memory cells are programmed according to a word line programming order. For example, the programming may start at the word line at the source side of the block and proceed to the word line at the drain side of the block. In one approach, each word line is programmed before programming a next word line. For example, a first word line, WL0, is programmed, then a second word line, WL1, is programmed and so forth until the last word line in the block is programmed. A program operation may use a set of increasing program voltages which are applied to the word line in respective program loops or program-verify iterations, such as depicted in FIG. 14A.

Verify tests may be performed after each program voltage to determine whether the memory cells have completed programming. A verify test can involve applying a control gate voltage of an assigned data state to the selected word line while sensing circuitry determines whether cells connected to the word line are in a conductive or non-conductive state. As in a read operation, the voltages of the unselected word lines are set to a read pass voltage which is high enough to place the unselected memory cells in a strongly conductive state, to avoid interfering with the sensing of the selected memory cells. If a memory cell is in a non-conductive state, the Vth of the memory cell exceeds the control gate voltage and the memory cell has reached the assigned data state. Programming is thus completed for the memory cell, and it can be locked out from further programming while programming continues for other memory cells in subsequent program loops.

The memory cells may also be programmed according to a sub-block programming order, where memory cells connected to a word line are programmed in one sub-block, then a next sub-block and so forth.

Each memory cell may be associated with a data state according to write data in a program command. Based on its data state, a memory cell will either remain in the erased state or be programmed to a programmed data state. For example, in a single bit per cell memory device, also referred to as SLC, or single level cell, there are two data states including the erased state and the programmed state. See FIG. 9E. MLC or multi-level cells store two or more bits per cell, as a multiple bit memory cell. For example, in a two-bit per cell memory device, there are four data states including the erased state and three higher data states referred to as the A, B and C data states. See FIG. 9D. In a three-bit per cell memory device, there are eight data states including the erased state and seven higher data states referred to as the A-G data states (see FIG. 9A). In a four-bit per cell memory device, there are sixteen data states including the erased state (S0) and fifteen higher data states (S0-S15).

After the memory cells are programmed, the data can be read back in a read operation. A read operation can involve applying a series of read voltages to a word line while sensing circuitry determines whether cells connected to the word line are in a conductive or non-conductive state. If a memory cell is in a non-conductive state, the Vth of the memory cell exceeds the read voltage. The read voltages are set at levels which are expected to be between the threshold voltage levels of adjacent data states. During the read operation, the voltages of the unselected word lines are set at a read pass voltage which is high enough to place the unselected memory cells in a strongly conductive state, to avoid interfering with the sensing of the selected memory cells.

In some 3D memory structures, the memory cells are arranged in vertical NAND strings (or other sets of connected memory cells) in a stack, where the stack comprises alternating conductive and dielectric layers. In this structure, the conductive layers act as word lines which are connected to the memory cells. Further, the memory cells may be formed by annular layers of blocking oxide, charge-trapping material, tunnel oxide and channel polysilicon which extend in the stack. The layers may be arranged concentrically. Each NAND string may have the shape of a pillar which intersects with the word lines to form the memory cells. Due to a desire to increase the height of the stack to allow for more layers and more memory cells in each NAND string, it becomes more difficult to etch low aspect ratio memory holes in which the NAND strings are formed. One approach is to form the stack and memory holes in two (or more) tiers. For example, see FIG. 16G where a stack 1626 comprises an upper tier 1616 formed on a lower tier 1605. The memory hole is etched separately in each tier so that a low aspect ratio can be achieved. The dielectric layer or region at the interface (IF) between the tiers is thicker than the other dielectric layers.

Figure 9A:
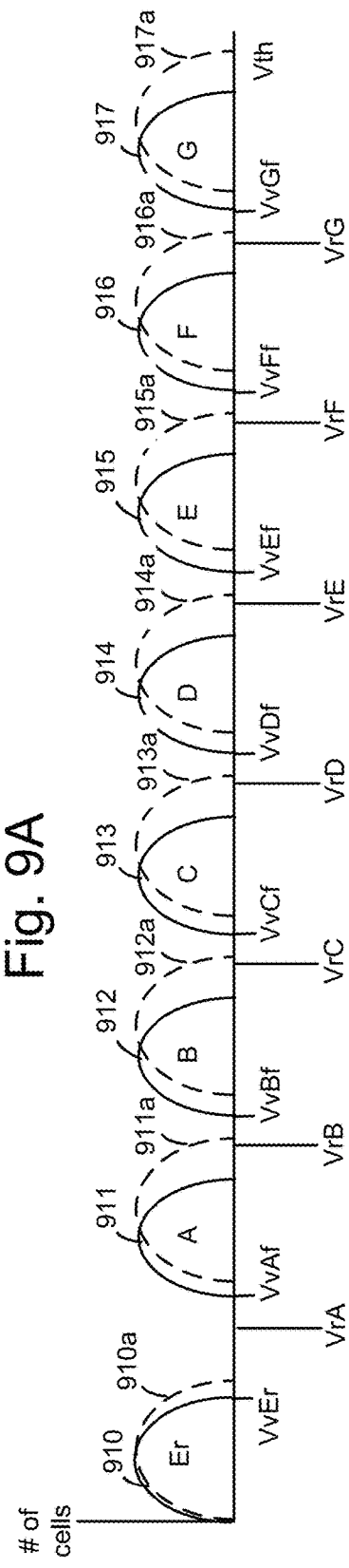
FIG. 9A depicts an example Vth distribution of a set of MLC memory cells in eight data states, with and without neighbor word line interference (NWI).

Neighbor word line interference (NWI) can occur in a single tier stack or a multi-tier stack. However, it has been observed that the characteristics of NWI, and corresponding countermeasures, are different in a multi-tier stack. NWI refers to an increase in the Vth of a memory cell connected to one word line when the neighbor (adjacent) memory cell in the same NAND string and connected to another word line is programmed. In particular, when a program voltage is applied to a word line, an electric field is created which draws electrons from the channel layer into a portion of the charge-trapping layer which is adjacent to the word line. See also FIG. 13B to 13D. However, the electric field includes a fringing or lateral component which can draw electrons from the channel layer into a portion of the charge-trapping layer which is between word lines. Electrons can also move laterally within the charge-trapping layer, resulting in an increase in the Vth of a previously programmed memory cell, also referred to as a victim memory cell. The increase in Vth is greatest when the victim memory cell is programmed to a low data state and therefore has a low Vth, and the neighbor memory cell is programmed to a high data state and therefore has a high Vth. The increase in Vth results in upshifted and widened Vth distributions, such as depicted in FIG. 9A. Moreover, this problem will become worse as memory devices are scaled down in size and the space between memory cells decreases.

Techniques provided herein address the above and other issues. In one aspect, a word line programming order is adjusted to reduce NWI. One embodiment involves programming word lines in an upper tier of a stack in an upward programming order and programming word lines in a lower tier of a stack in a downward programming order. See FIG. 12B. Another embodiment involves programming a first group of word lines in an upper tier in an upward programming order and programming a second group of word lines in the upper tier, and the word lines in the lower tier, in a downward programming order. See FIG. 12C.

Additionally, countermeasures may be taken to reduce NWI for a first-programmed word line in the stack. Example countermeasures include reducing a number of bits per memory cell, programming in multiple passes and/or programming using lower verify voltages. By reducing the number of bits per memory cell, the Vth distributions of the data states can be separated by a greater margin to compensate for the NWI. For example, compare the Vth distributions of FIGS. 9D and 9E to those in FIG. 9A. When programming in multiple passes, a first program pass may occur at a start of the programming of the block and a final program pass may occur at an end of the programming of the block, or at least after both neighbor word lines of the first-programmed word line have been programmed. The first program pass may use lower verify voltages than the second program pass, to allow for some Vth upshift due to NWI. See FIG. 9C. Programming with lower verify voltages, e.g., in a single program pass, can also allow for some Vth upshift due to NWI. See FIG. 9B.

In another aspect, the height or control gate length d2a of the first-programmed word line can be made greater than the height or control gate length of other word lines. See FIG. 13D. In another aspect, the height d1a of one or both dielectric layers adjacent to the first-programmed word line can be made greater than the heights of other dielectric layers. See FIG. 13E. Both of these approaches, which involves a physical modification to the memory device during the fabrication process, can help make the first-programmed memory cell of a NAND string less susceptible to NWI.

These and other features are discussed further below.

Figure 1:
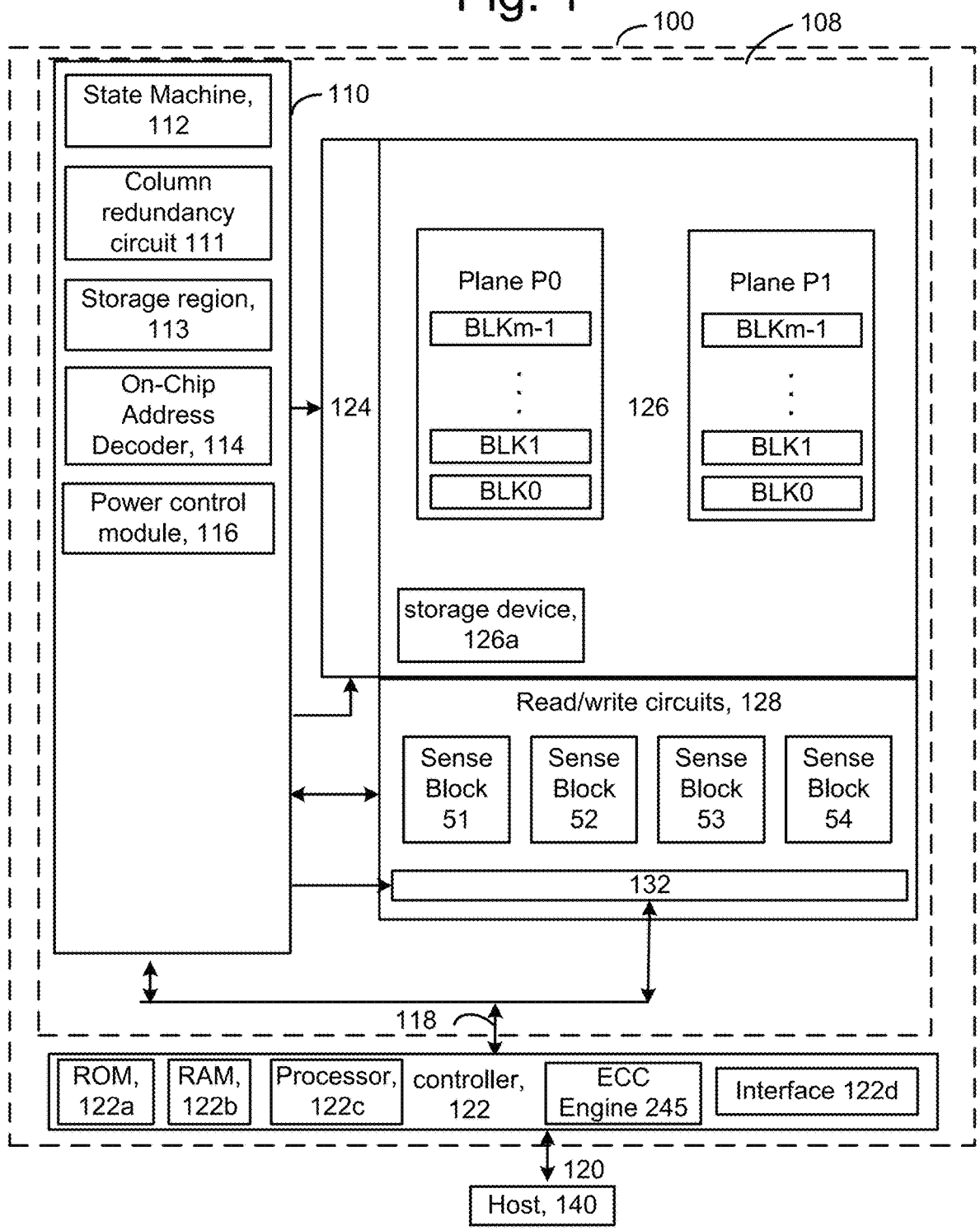
FIG. 1 is a block diagram of an example memory device.

FIG. 1 is a block diagram of an example memory device. The memory device 100, such as a non-volatile storage system, may include one or more memory die 108, also referred to as a chip or integrated circuit. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. In one embodiment, the memory structure comprise blocks of memory cells arranged in one or more planes. For example, blocks BLK0-BLKm−1 are arranged in each of planes P0 and P1. A plane may be an area of a substrate with a diffusion layer (such as the well region 433 in FIG. 3) which is common to each block in the plane, in one approach. The blocks in a plane typically share a common set of bit lines.

The read/write circuits 128 include multiple sense blocks 51-54 (sensing circuitry) and allow a page of memory cells to be read or programmed in parallel. Typically a controller 122 is included in the same memory device 100 (e.g., a removable storage card) as the one or more memory die 108. The controller may be separate from the memory die. Commands and data are transferred between the host 140 and controller 122 via a data bus 120, and between the controller and the one or more memory die 108 via a path 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, a column redundancy circuit 111, an on-chip address decoder 114, and a power control module 116 (power control circuit). The state machine 112 provides chip-level control of memory operations. A storage region 113 may be provided, e.g., for operational parameters and software/code. In one embodiment, the state machine is programmable by the software. In other embodiments, the state machine does not use software and is completely implemented in hardware (e.g., electrical circuits).

The column redundancy circuit provides a mapping between spare NAND strings which replace defective primary NAND strings. The on-chip address decoder 114 provides an address interface between that used by the host or a memory controller to the hardware address used by the decoders 124 and 132. The power control module 116 controls the power and voltages supplied to the word lines, select gate lines, bit lines and source lines during memory operations. It can include drivers for word lines, SGS and SGD transistors and source lines. See also FIG. 3. The sense blocks can include bit line drivers, in one approach.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control module 116, sense blocks 51-54, read/write circuits 128, controller 122, and so forth.

The off-chip controller 122 (which in one embodiment is an electrical circuit) may comprise a processor 122c, storage devices (memory) such as ROM 122a and RAM 122b and an error-correction code (ECC) engine 245. The ECC engine can correct a number of read errors.

The controller 122 or control circuitry 110 can be configured with hardware, firmware and/or software for implementing the processes described herein, including the processes of the flowchart of FIG. 11A.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure. In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 2:
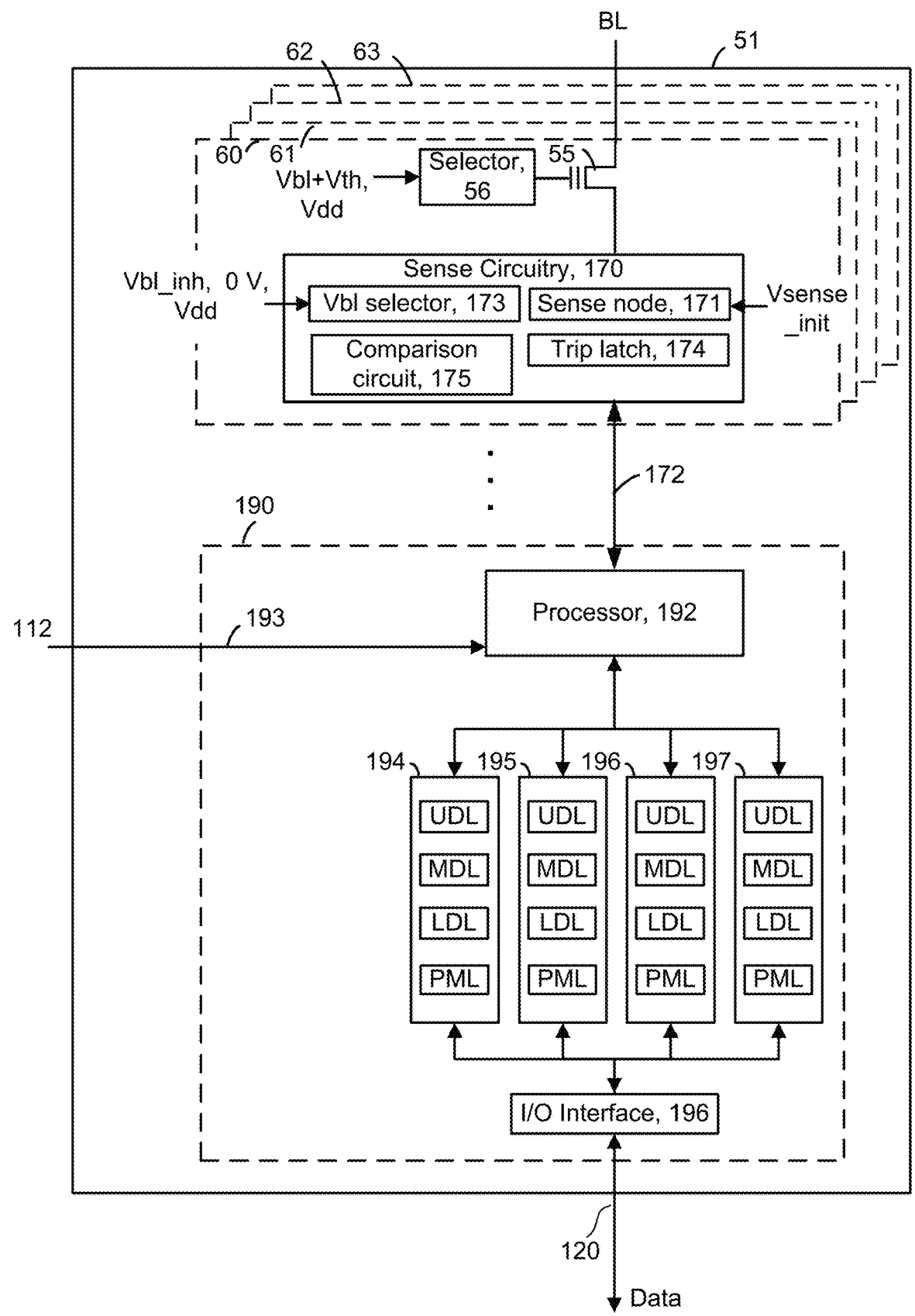
FIG. 2 is a block diagram depicting one embodiment of the sense block 51 of FIG. 1.

FIG. 2 is a block diagram depicting one embodiment of the sense block 51 of FIG. 1. An individual sense block 51 is partitioned into one or more core portions, referred to as sense circuits 60-63 or sense amplifiers, and a common portion, referred to as a managing circuit 190. In one embodiment, there will be a separate sense circuit for each bit line/NAND string and one common managing circuit 190 for a set of multiple, e.g., four or eight, sense circuits. Each of the sense circuits in a group communicates with the associated managing circuit via data bus 172. Thus, there are one or more managing circuits which communicate with the sense circuits of a set of storage elements (memory cells).

The sense circuit 60, as an example, comprises sense circuitry 170 that performs sensing by determining whether a conduction current in a connected bit line is above or below a predetermined threshold level. The sensing can occur in a read or verify operation. The sense circuit also supplies a bit line voltage during the application of a program voltage in a program operation.

The sense circuitry may include a Vbl selector 173, a sense node 171, a comparison circuit 175 and a trip latch 174. During the application of a program voltage, the Vbl selector 173 can pass Vbl_inh (e.g., 2 V) to a bit line connected to a memory cell which is inhibited from programmed, or 0 V to a bit line connected to a memory cell which is being programmed in the current program loop. A transistor 55 (e.g., an nMOS) can be configured as a pass gate to pass Vbl from the Vbl selector 173, by setting the control gate voltage of the transistor sufficiently high, e.g., higher than the Vbl passed from the Vbl selector. For example, a selector 56 may pass a power supply voltage Vdd, e.g., 3-4 V to the control gate of the transistor 55.

During sensing operations such as verify operations which occur during the application of a verification signal, the bit line voltage is set by the transistor 55 based on the voltage passed by the selector 56. The bit line voltage is roughly equal to the control gate voltage of the transistor minus its Vth (e.g., 1 V). For example, if Vbl+Vth is passed by the selector 56, the bit line voltage will be Vbl. This assumes the source line is at 0 V. The transistor 55 clamps the bit line voltage according to the control gate voltage and acts a source-follower rather than a pass gate. The Vbl selector 173 may pass a relatively high voltage such as Vdd which is higher than the control gate voltage on the transistor 55 to provide the source-follower mode. During sensing, the transistor 55 thus charges up the bit line.

In one approach, the selector 56 of each sense circuit can be controlled separately from the selectors of other sense circuits, to pass Vbl or Vdd. The Vbl selector 173 of each sense circuit can also be controlled separately from the Vbl selectors of other sense circuits During sensing, the sense node 171 is charged up to an initial voltage such as Vsense_init=3 V. The sense node is then connected to the bit line via the transistor 55, and an amount of decay of the sense node is used to determine whether a memory cell is in a conductive or non-conductive state. The comparison circuit 175 is used to compare the sense node voltage to a trip voltage at a sense time. If the sense node voltage decays below the trip voltage Vtrip, the memory cell is in a conductive state and its Vth is at or below the voltage of the verification signal. If the sense node voltage does not decay below Vtrip, the memory cell is in a non-conductive state and its Vth is above the voltage of the verification signal. The sense circuit 60 includes a trip latch 174 that is set by the comparison circuit 175 based on whether the memory cell is in a conductive or non-conductive state. The data in the trip latch can be a bit which is read out by the processor 192.

The managing circuit 190 comprises a processor 192, four example sets of data latches 194-197 and an I/O Interface 196 coupled between the set of data latches 194 and data bus 120. One set of data latches, e.g., comprising individual latches LDL, MDL and UDL, can be provided for each sense circuit. In some cases, additional data latches may be used. LDL stores a bit for a lower page of data, MDL stores a bit for a lower page of data, and UDL stores a bit for an upper page of data. This is in an eight-level or three-bits per memory cell memory device. When multi-pass programming is used, one additional data latch per bit line can be provided. PML stores a bit indicating whether the Vth of the associated memory cell exceeds a verify voltage of the first program pass.

The processor 192 performs computations, such as to determine the data stored in the sensed memory cell and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed memory cell. As it steps through the various predefined control gate voltages corresponding to the various memory states supported by the memory, the sense circuit may trip at one of these voltages and a corresponding output will be provided from sense circuit to processor 192 via the data bus 172. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 120, in the LDL, MDL and UDL latches, in a three-bit per memory cells implementation.

The program operation, under the control of the state machine, comprises a series of programming voltage pulses applied to the control gates of the addressed memory cells. See FIG. 10A. Each program voltage is followed by a verify operation to determine if the memory cells has been programmed to the desired memory state. In some cases, processor 192 monitors the read back memory state relative to the desired memory state. When the two are in agreement, the processor 192 sets the bit line in a program inhibit mode such as by updating its latches. This inhibits the memory cell coupled to the bit line from further programming even if additional program pulses are applied to its control gate.

Each set of data latches 194-197 may be implemented as a stack of data latches for each sense circuit. In one embodiment, there are three data latches per sense circuit 60. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated memory cell has reached certain mileposts in a program operations. For example, latches may identify that a memory cell's Vth is below a particular verify voltage. The data latches indicate whether a memory cell currently stores one or more bits from a page of data. For example, the LDL latches can be used to store a lower page of data. An LDL latch is flipped (e.g., from 0 to 1) when a lower page bit is stored in an associated memory cell. An MDL or UDL latch is flipped when a middle or upper page bit, respectively, is stored in an associated memory cell. This occurs when an associated memory cell completes programming.

Figure 3:
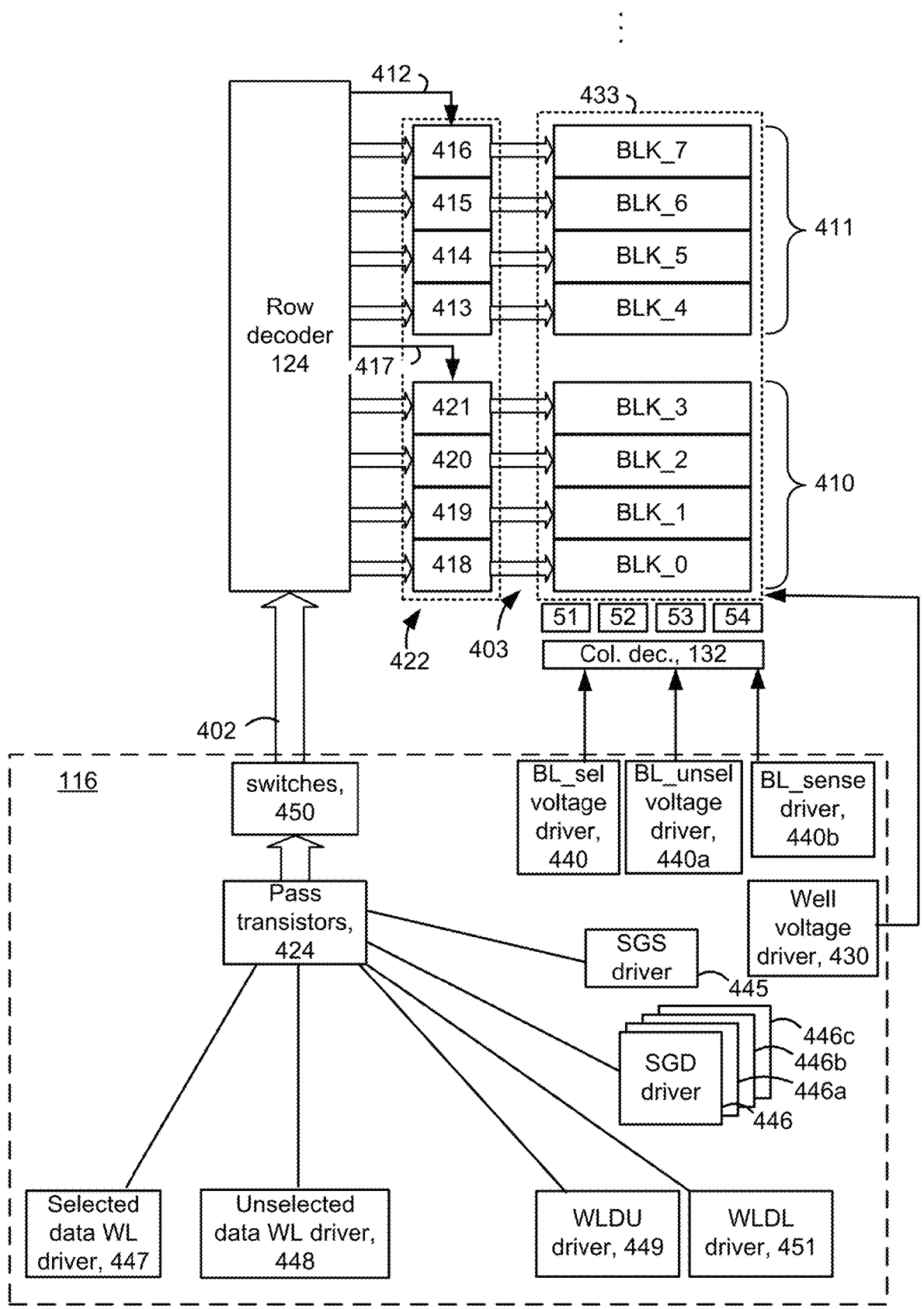
FIG. 3 depicts an example implementation of the power control module 116 of FIG. 1 for providing voltages to blocks of memory cells.

FIG. 3 depicts an example implementation of the power control module 116 of FIG. 1 for providing voltages to blocks of memory cells. In this example, the memory structure 126 includes a set 410 of four related blocks, BLK_0 to BLK_3, and another set 411 of four related blocks, BLK_4 to BLK_7. The blocks can be in one or more planes. The row decoder 124 of FIG. 1 provides voltages to word lines and select gates of each block via pass transistors 422. The row decoder provides a control signal to pass transistors which connect the blocks to the row decoder. In one approach, the pass transistors of each set of blocks are controlled by a common control gate voltage. Thus, the pass transistors for a set of block are either all on or off at a given time. If the pass transistors are on, a voltage from the row decoder is provided to the respective control gate lines or word lines. If the pass transistors are off, the row decoder is disconnected from the respective control gate lines or word lines so that the voltage floats on the respective control gate lines or word lines.

For instance, a control gate line 412 is connected to sets of pass transistors 413, 414, 415 and 416, which in turn are connected to control gate lines of BLK_4, BLK_5, BLK_6 and BLK_7, respectively. A control gate line 417 is connected to sets of pass transistors 418, 419, 420 and 421, which in turn are connected to control gate lines of BLK_0, BLK_1, BLK_2 and BLK_3, respectively.

Typically, program or read operations are performed on one selected block at a time and on one selected sub-block of the block. An erase operation may be performed on a selected block or sub-block. The row decoder can connect global control lines 402 to local control lines 403. The control lines represent conductive paths. Voltages are provided on the global control lines from a number of voltage drivers. Some of the voltage drivers may provide voltages to switches 450 which connect to the global control lines. Pass transistors 424 are controlled to pass voltages from the voltage drivers to the switches 450.

The voltage drivers can include a selected data word line (WL) driver 447, which provides a voltage on a data word line selected during a program or read operation. The voltage drivers can also include a driver 448 for unselected data word lines. These can be remaining, unselected word lines other than the selected word line. The voltage drivers can also include an upper interface word line driver 449 which provides voltages on an upper interface word line WLDU, and a lower interface word line driver 451 which provides voltages on a lower interface word line WLDL. See FIG. 5. WLDU is adjacent to and above an interface of a multi-tier stack, and WLDL is adjacent to and below the interface.

Figures 7A, 7B:
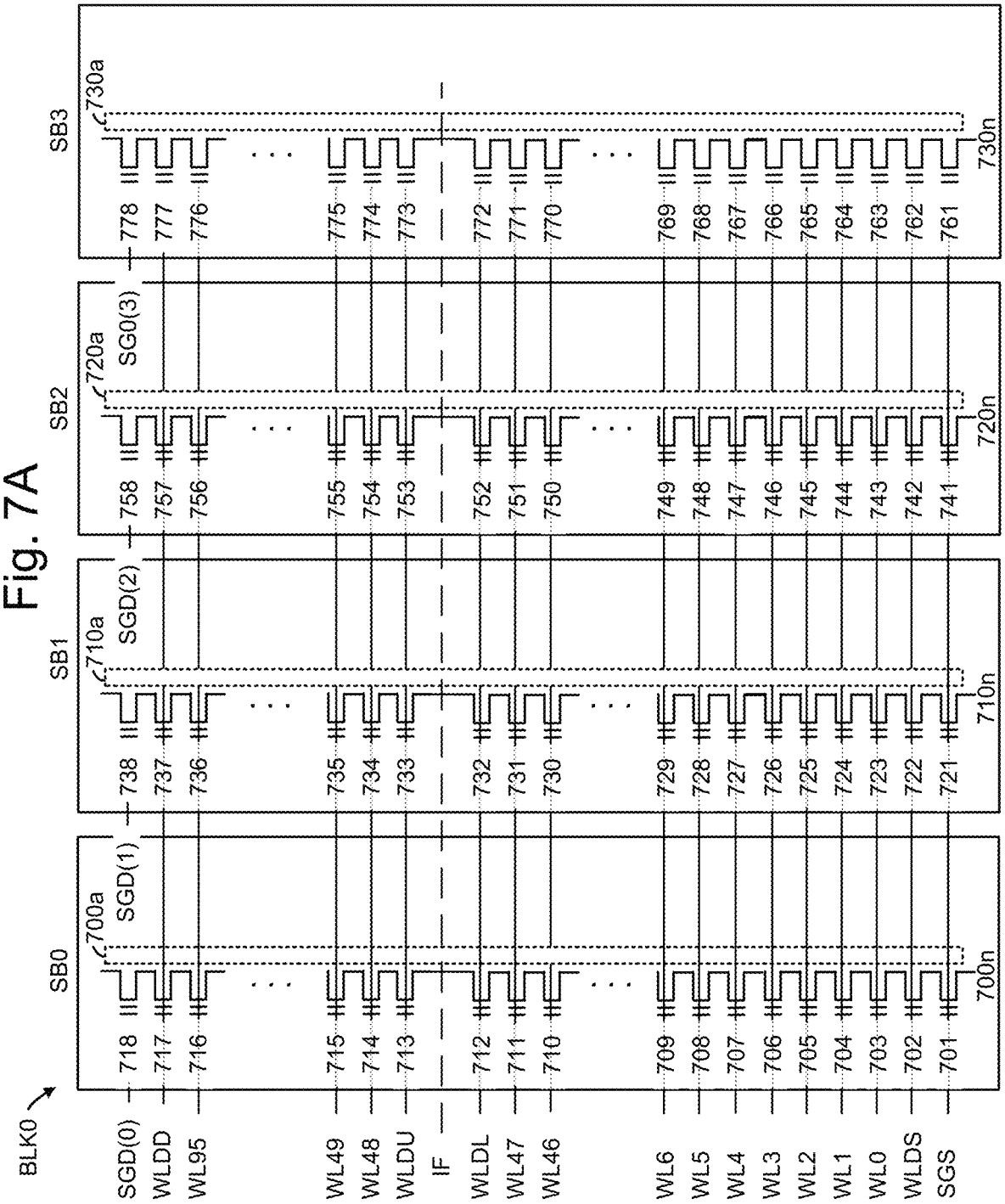
FIG. 7A depicts an example view of NAND strings in sub-blocks in a 3D configuration which is consistent with the two-tier stack of FIG. 5.
FIG. 7B depicts an example transistor 650 which represents any of the memory cells or select gate transistors of FIG. 7A.

The voltage drivers can also include separate SGD drivers for each sub-block in a block. For example, in BLK0 as depicted in FIG. 7A, SGD drivers 446, 446a, 446b and 446c can be provided for SGD(0)-SGD(3), respectively, in SB0-SB3, respectively. In one option, one SGS driver 445 is common to the different sub-blocks in a block. In another option, separate SGS drivers are provided for each sub-block of a block. Moreover, in some cases, there can be multiple SGD transistors, multiple SGS transistors, multiple drain side dummy memory cells and/or multiple source side dummy memory cells in each NAND string. To provide the greatest flexibility in programming these memory cells and transistors with program voltages or other word line specific parameters, there can be a separate driver for each select gate transistor and dummy memory cell in a NAND string, in one approach. Or, for simplicity, the multiple SGD transistors may be connected and commonly driven, the multiple SGS transistors may be connected and commonly driven, the multiple drain side dummy memory cells may be connected and commonly driven and the multiple source side dummy memory cells may be connected and commonly driven.

The various components, including the row decoder, may receive commands from a controller such as the state machine 112 or the controller 122 to perform the functions described herein.

In one approach, the well region 433 is common to the blocks and may be driven by a voltage driver 430. A set of bit lines is also shared by the blocks. During a program operation, a BL_sel bit line voltage driver 440 provides voltages to the selected bit lines and a BL_unsel bit line voltage driver 440a provides voltages to the unselected bit lines. During a sensing operation, a BL_sense bit line voltage driver 440b provides voltages to the bit lines.

In a stacked memory device such as depicted in FIGS. 4 to 8, sets of connected memory cells may be arranged in NAND strings which extend vertically upward from the substrate. The bottom (or source end) of each NAND string is in contact with the well region, and the top end (or drain end) of each NAND string is connected to a respective bit line, in one approach. The vertically extending NAND strings have a floating channel.

Figure 4:
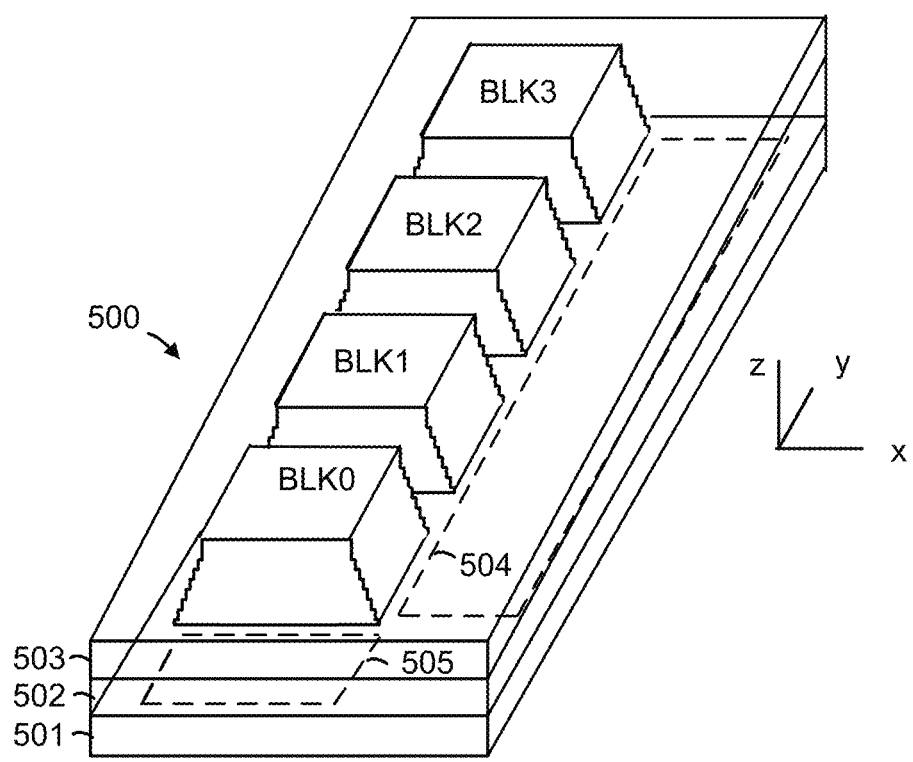
FIG. 4 is a perspective view of a memory device 500 comprising a set of blocks in an example 3D configuration of the memory structure 126 of FIG. 1.

FIG. 4 is a perspective view of a memory device 500 comprising a set of blocks in an example 3D configuration of the memory structure 126 of FIG. 1. On the substrate 501 are example blocks BLK0, BLK1, BLK2 and BLK3 of memory cells (storage elements) and peripheral areas with circuitry for use by the blocks. The peripheral area 504 runs along an edge of each block while the peripheral area 505 is at an end of the set of blocks. The circuitry can include voltage drivers which can be connected to control gate layers, bit lines and source lines of the blocks. In one approach, control gate layers at a common height in the blocks are commonly driven. The substrate 501 can also carry circuitry under the blocks, and one or more lower metal layers which are patterned in conductive paths to carry signals of the circuitry. The blocks are formed in an intermediate region 502 of the memory device. In an upper region 503 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

Figure 5:
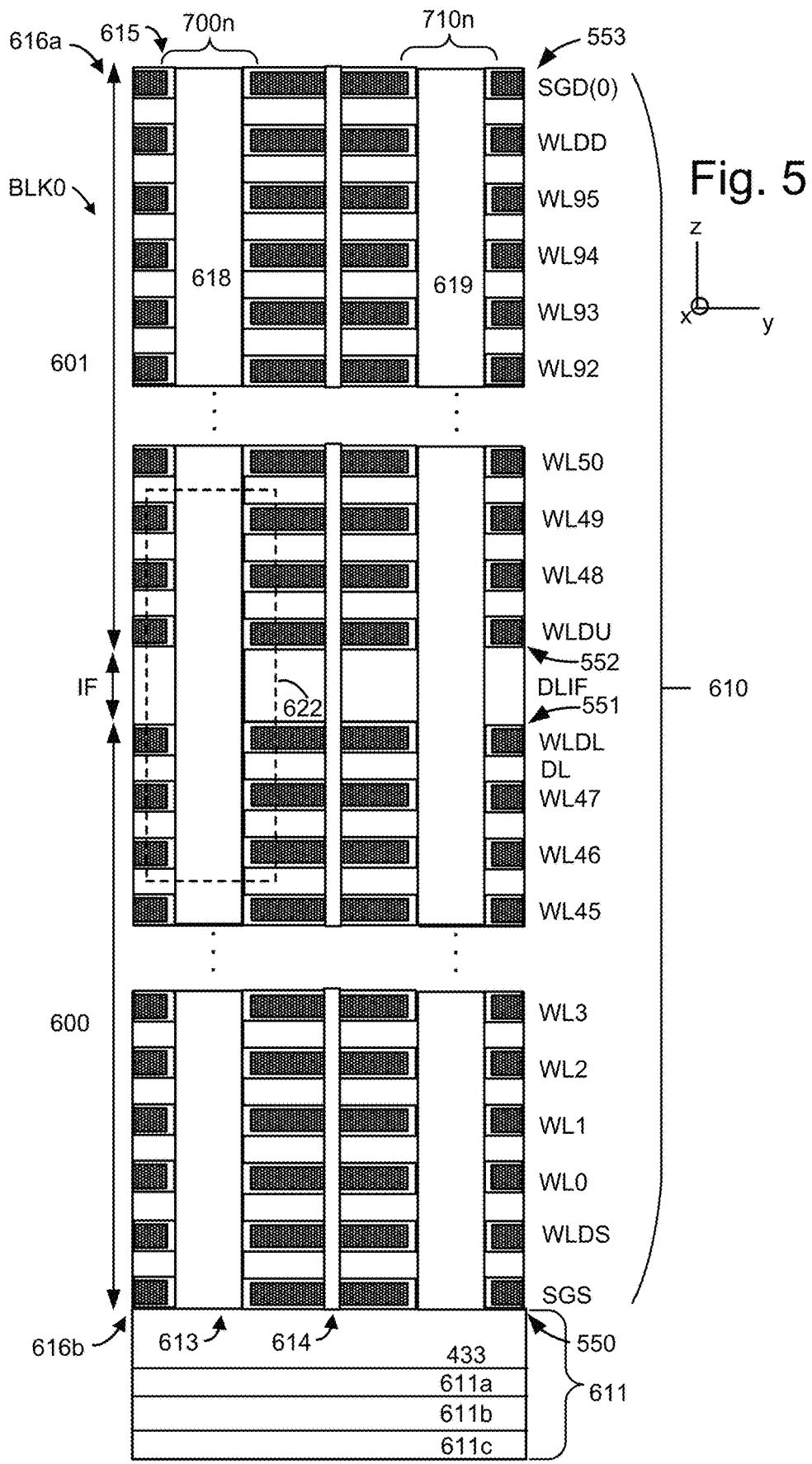
FIG. 5 depicts an example cross-sectional view of a portion of BLK0 of FIG. 4, including NAND strings 700n and 710n.

FIG. 5 depicts an example cross-sectional view of a portion of BLK0 of FIG. 4, including NAND strings 700n and 710n. The block comprises a stack 610 of alternating conductive and dielectric layers in two tiers including a lower tier 600 (e.g., a first tier or a bottom tier) and an upper tier 601 (e.g., a second tier or a top tier). The tiers are separated by an interface (IF) (or interface region or junction) which is formed of dielectric material. The conductive layers comprise SGS, WLDS, WL0-WL47, WLDL, WLDU, WL48-WL95, WLDD and SGD(0). WLDS, WLDL, WLDU and WLDD are dummy word lines or conductive layers connected to dummy memory cells which are ineligible to store user data, WL0-WL47 are data word lines or conductive layers in the lower tier connected to data memory cells which are eligible to store user data, and WL48-WL95 are data word lines in the upper tier. As an example only, the stack includes 96 data word lines, and the data word lines are evenly divided between the two tiers. DL is an example dielectric layer outside the interface, and DLIF is a dielectric layer of the interface.

A top 553 of the upper tier and the stack is depicted along with a bottom 552 of the upper tier, a top 551 of the lower tier and a bottom 550 of the lower tier and the stack.

WLDL and WLDU are examples of unselected word lines adjacent to the interface, and WL0-WL47 and WL48-WL95 are examples of unselected word lines non-adjacent to the interface in the lower and upper tiers, respectively.

The NAND strings each comprise a memory hole 618 or 619, respectively, which is filled with materials which form memory cells adjacent to the word lines. For example, see region 622 of the stack which is shown in greater detail in FIG. 6.

The stack is formed on a substrate 611. In one approach, a well region 433 (see also FIG. 3) is an n-type source diffusion layer or well in the substrate. The well region is in contact with a source end of each string of memory cells in a block. The n-type well region 433 in turn is formed in a p-type well region 611a, which in turn is formed in an n-type well region 611b, which in turn is formed in a p-type semiconductor substrate 611c, in one possible implementation. The n-type source diffusion layer may be shared by all of the blocks in a plane, in one approach, and form a source line SL which provides a voltage to a source end of each NAND string.

The NAND string 700n has a source end 613 at a bottom 616b of the stack 610 and a drain end 615 at a top 616a of the stack. Metal-filled slits (see also FIG. 16G.) may be provided periodically across the stack as interconnects which extend through the stack, such as to connect the source line to a line above the stack. The slits may be used during the formation of the word lines and subsequently filled with metal. Vias may be connected at one end to the drain ends of the NAND strings and at another end to a bit line.

In one approach, the block of memory cells comprises a stack of alternating control gate and dielectric layers, and the memory cells are arranged in vertically extending memory holes in the stack.

In one approach, each block comprises a terraced edge in which vertical interconnects connect to each layer, including the SGS, WL and SGD layers, and extend upward to horizontal paths to voltage drivers. See also FIG. 16G.

An insulation-filled region 614 separates the block into sub-blocks, where the NAND strings 700n and 710n are in different sub-blocks.

Figure 6:
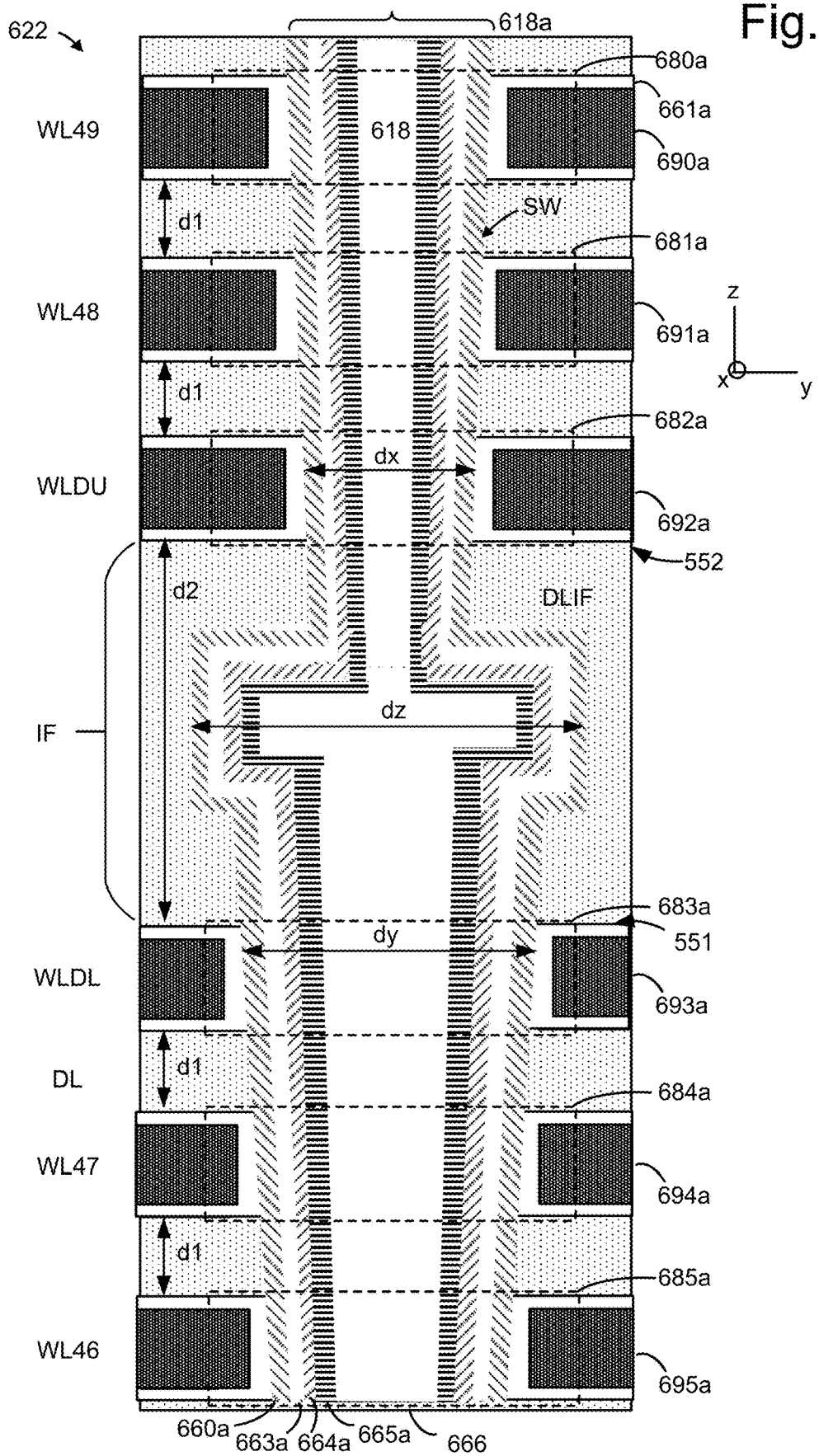
FIG. 6 depicts a close-up view of the region 622 of the stack of FIG. 5.

FIG. 6 depicts a close-up view of the region 622 of the stack of FIG. 5. The region includes the three word lines below the interface, WL46, WL47 and WLDL, and the three word lines above the interface, WLDU, WL48 and WL49. Generally, the NAND string comprises memory cells connected to respective word lines. This example includes memory cells 680a, 681a, 682a, 683a, 684a and 685a connected to word lines WL49, WL48, WLDU, WLDL, WL47 and WL46, respectively. The word lines or word line layers are spaced apart by dielectric layers, which each have a thickness or height of d1 (a first distance) outside the interface, and by DLIF, which has a larger thickness or height of d2 (a second distance) in the interface. D1 and d2 are also inter-cell distances, or distances between adjacent memory cells along the z or vertical axis. In one approach, d2 is at least 1.5-4 times the height of d1. DLIF can be an aggregated layer which is made up of dielectric materials which are deposited in one or more separate layers on top of one another. The thickness or height of d2 of the interface is the greatest inter-memory cell spacing in the NAND string.

The memory cell 682a is connected to WLDU, and is adjacent to and above the interface. The memory cell 683a is connected to WLDL, and is adjacent to and below the interface. These are interface memory cells. The second distance spans the interface. In some cases, the memory cells 682a and 683a can be set as dummy memory cells which are ineligible to store user data, due to the difficulty in controlling the channel region along the interface. WLDU and WLDL are dummy word lines in this case.

The memory hole which is etched through each tier of the stack has a tapered shape, e.g., wider at the top and narrower at the bottom. As a result, the memory hole diameter dy at the top word line layer or memory cell in the bottom tier is larger than the memory hole diameter dx at the bottom word line layer or memory cell in the top tier. A diameter dz represents a widest region of the memory hole. This widened region is used to accommodate small misalignments in the memory hole portion of the top tier relative to the memory hole portion in the bottom tier. The increased thickness d2 of DLIF is provided due to process margin concerns and also accommodates misalignment by providing a transition region between the memory hole portions in the two tiers.

The diameter of the memory hole thus changes abruptly partway along a height of the memory hole.

A number of layers or films can be deposited along the sidewall of the memory hole. The layers can conform to the changing diameter in the interface. For example, the layers can include a blocking oxide/block high-k material 660a, a charge-trapping layer 663a (e.g., silicon nitride (Si3N4) or other nitride), a tunneling layer 664a (e.g., oxide) and a channel 665a layer (e.g., polysilicon). A dielectric core 666 (e.g., silicon dioxide) fills a remainder of the memory hole. A pillar 618a or column can be formed by the materials within a memory hole as an active area of a NAND string. Referring to WL49 as an example, a word line layer can include a metal barrier 661a, and a conductive metal 662a as a control gate. For example, control gates 690a, 691a, 692a, 693a, 694a and 695a are provided. The NAND string can be considered to have a floating body channel because the length of the channel is not formed on a substrate. When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

In FIGS. 5 and 6, a NAND string 700n, 710n extends in a memory hole 618, 619, and the memory hole comprises a portion 1632 (FIG. 16C) in the lower tier and a portion 1624 in the upper tier. Also, at the interface (IF), a width dy of the portion in the lower tier is greater than a width dx of the portion in the upper tier.

FIG. 7A depicts an example view of NAND strings in sub-blocks in a 3D configuration which is consistent with the two-tier stack of FIG. 5. Each sub-block includes multiple NAND strings or other sets of memory cells connected to one another, where one example NAND string is depicted for each sub-block. The memory cells in a set may be connected to one another serially. For example, SB0, SB1, SB2 and SB3 comprise example NAND strings 700n, 710n, 720n and 730n, respectively. In this example, each NAND string has one SGD transistor, one drain-side dummy memory cell, 96 data memory cells (where 48 are above the interface IF, i.e., connected to WL48-WL95, and 48 are below the interface, i.e., connected to WL0-WL47), one source-side dummy memory cell and one SGS transistor.

In the block BLK0, each sub-block comprises a set of NAND strings which extend in the x direction and which have a common SGD line. The NAND strings 700n, 710n, 720n and 730n are in sub-blocks SB0, SB1, SB2 and SB3, respectively. Programming of the block may occur one sub-block at a time. Within each sub-block, a word line programming order may be followed, e.g., starting at WL0, the source end word line and proceeding one word line at a time to WL95, the drain end data word line.

The NAND strings 700n, 710n, 720n and 730n have channels 700a, 710a, 720a and 730a, respectively. Each channel can extend continuously from a source end select gate transistor to a drain end select gate transistor. For example, the channel 700a extends continuously in the NAND strings 700n from the SGS transistor 701 to the SGD transistor 718. The channel 700a is continuous in that it is uninterrupted and can therefore provide a continuous conductive path in the NAND string.

NAND string 700n includes SGS transistor 701, source-side dummy memory cell 702 connected to WLDS, lower tier data memory cells 703-711 connected to WL0-WL47, respectively, interface-adjacent dummy memory cell 712 connected to WLDL, interface-adjacent dummy memory cell 713 connected to WLDU, upper tier data memory cells 714-716 connected to WL48-WL95, respectively, drain-side dummy memory cell 717 connected to WLDD, and SGD transistor 718 connected to SGD(0).

Similarly, NAND string 710n includes SGS transistor 721, source-side dummy memory cell 722 connected to WLDS, lower tier data memory cells 723-731 connected to WL0-WL47, respectively, interface-adjacent dummy memory cell 732 connected to WLDL, interface-adjacent dummy memory cell 733 connected to WLDU, upper tier data memory cells 734-736 connected to WL48-WL95, respectively, drain-side dummy memory cell 737 connected to WLDD, and SGD transistor 738 connected to SGD(1).

NAND string 720n includes SGS transistor 741, source-side dummy memory cell 742 connected to WLDS, lower tier data memory cells 743-751 connected to WL0-WL47, respectively, interface-adjacent dummy memory cell 752 connected to WLDL, interface-adjacent dummy memory cell 753 connected to WLDU, upper tier data memory cells 754-756 connected to WL48-WL95, respectively, drain-side dummy memory cell 757 connected to WLDD, and SGD transistor 758 connected to SGD(2).

NAND string 730n includes SGS transistor 761, source-side dummy memory cell 762 connected to WLDS, lower tier data memory cells 763-771 connected to WL0-WL47, respectively, interface-adjacent dummy memory cell 772 connected to WLDL, interface-adjacent dummy memory cell 773 connected to WLDU, upper tier data memory cells 774-776 connected to WL48-WL95, respectively, drain-side dummy memory cell 777 connected to WLDD, and SGD transistor 778 connected to SGD(3).

In this example, the memory cells 713, 733, 753 and 773 are adjacent to and above the interface, and the memory cells 712, 732, 752 and 772 are adjacent to and below the interface.

FIG. 7B depicts an example transistor 650 which represents any of the memory cells or select gate transistors of FIG. 7A. The transistor comprises a control gate CG, a drain D, a source S and a channel CH and may represent a memory cell or a select gate transistor, for example.

Figure 8:
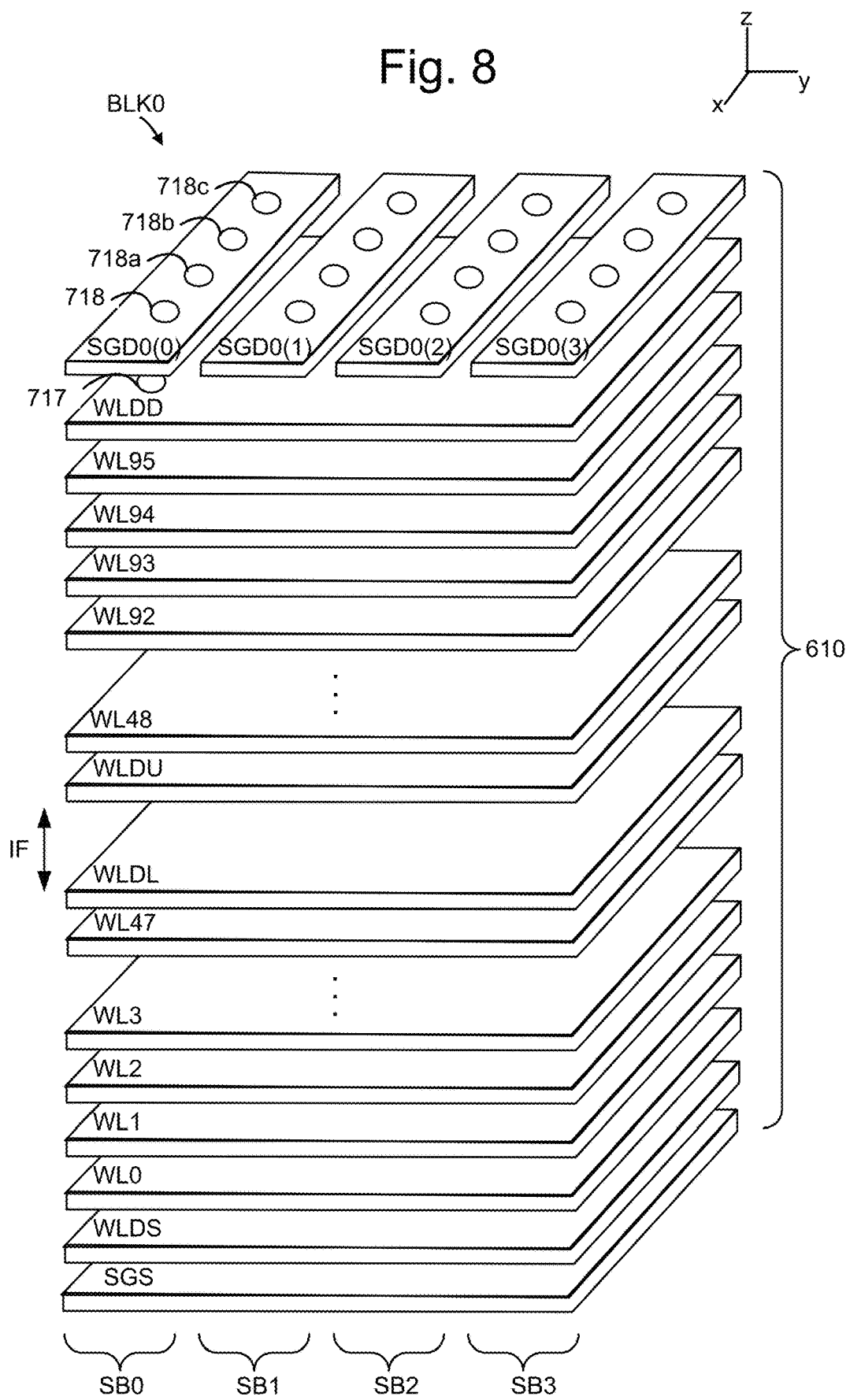
FIG. 8 depicts control gate layers in BLK0 consistent with FIG. 5-7A.

FIG. 8 depicts control gate layers in BLK0 consistent with FIG. 5-7A. The control gate layers are arranged in the stack 610 and include the layers SGS, WLDS, WL0-WL47, WLDL, WLDU, WL48-WL95, WLDD and SGD(0)-SGD (3). The SGS control gate layer is common for the block. Optionally, a separate SGS control gate layer could be provided for each sub-block. Additionally, four example memory holes are depicted in each sub-block. As mentioned, select gate transistors and memory cells can be formed along each memory hole in a NAND string. For example, SGD transistors 718, 718a, 718b and 718c are depicted in SGD0 (0), and a dummy memory cell 717 is depicted in WLDD.

FIG. 9A depicts an example Vth distribution of a set of MLC memory cells in eight data states, with and without neighbor word line interference (NWI). The memory cells are connected to a selected word line. In this example, the program operation involves a single program pass, and one verify voltage is associated with each programmed data state. Specifically, verify voltages VvAf, VvBf, VvCf, VvDf, VvEf, VvFf and VvGf are associated with the A, B, C, D, E, F and G data states, respectively. The program operation is completed when the Vth of the programmed memory cells exceeds the respective verify voltage of the assigned data state.

At a start of a program operation, the memory cells are all initially in the erased state as represented by the Vth distribution 910. After the program operation is successfully completed, the memory cells assigned to the Er state are represented by the Vth distribution 910a. The Vth distribution of the Er state is upshifted due to program disturb.

The memory cells which are programmed to the A, B, C, D, E, F and G states are represented by the Vth distributions 911, 912, 913, 914, 915, 916 and 917, respectively, immediately after programming is completed, and before NWI. The verify voltages are used in the verify operations or tests of the memory cells. These verify voltages are also referred to as final verify voltages.

After an adjacent word line is programmed, the Vth distributions are widened and shifted higher due to NWI as represented by the Vth distributions 911a, 912a, 913a, 914a, 915a, 916a and 917a for the A, B, C, D, E, F and G states, respectively. Read voltages VrA, VrB, VrC, VrD, VrE, VrF and VrG can be used for reading the states of the memory cells in a read operation. NWI can result in read errors if the Vth of a memory cell is increased above a read voltage. For example, the upper tail of the Vth distribution 911a exceeds VrB so that the associated memory cells will be read as being in the B-state and not the A state.

In an erase operation, the data memory cells transition from the Vth distributions of the programmed data states, e.g., states A-G, to the erased state. The erase operation includes an erase phase in which the memory cells are biased for erasing followed by an erase-verify test. The erase-verify test can use an erase verify voltage, VvEr, which is applied.

Figure 9B:
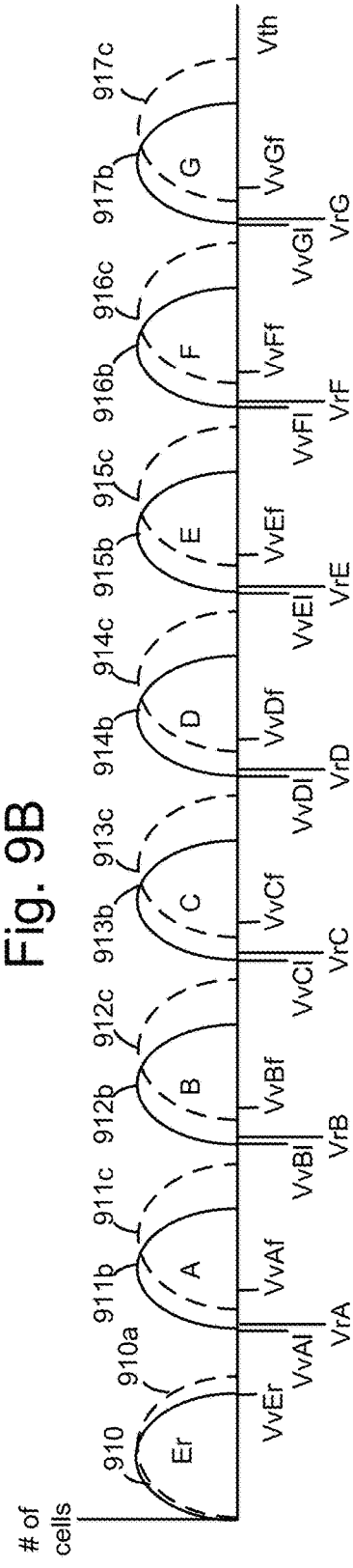
FIG. 9B depicts an example Vth distribution of a set of MLC memory cells in eight data states, with and without NWI, where the verify voltages are lower compared to FIG. 9A.

FIG. 9B depicts an example Vth distribution of a set of MLC memory cells in eight data states, with and without NWI, where the verify voltages are lower compared to FIG. 9A. One countermeasure to NWI is to lower the verify voltages to allow a margin for the subsequent Vth upshift which occurs due to NWI. In this example, lower verify voltages VvAl, VvBl, VvCl, VvDl, VvEl, VvFl and VvGl are used for the A, B, C, D, E, F and G states, respectively.

For each programmed data state, the verify voltage in FIG. 9B is less than the corresponding verify voltage in FIG. 9A.

As in FIG. 9A, the program operation involves a single program pass, and one verify voltage is associated with each programmed data state. The program operation is completed when the Vth of the programmed memory cells exceeds the respective verify voltage of the assigned data state.

The memory cells which are programmed to the A, B, C, D, E, F and G states are represented by the Vth distributions 911b, 912b, 913b, 914b, 915b, 916b and 917b, respectively, immediately after programming is completed, and before NWI.

After an adjacent word line is programmed, the Vth distributions are widened and shifted higher due to NWI as represented by the Vth distributions 911c, 912c, 913c, 914c, 915c, 916c and 917a for the A, B, C, D, E, F and G states, respectively.

In one example, each memory cell of the upper tier is in a set of memory cells connected to a respective word line, and a verify voltage (e.g., VvAl-VvGl) used for a first-programmed word line of the respective word lines is lower than a verify voltage (e.g., VvAf-VvGf) used for other word lines, for at least one data state (e.g., A-G).

Figure 9C:
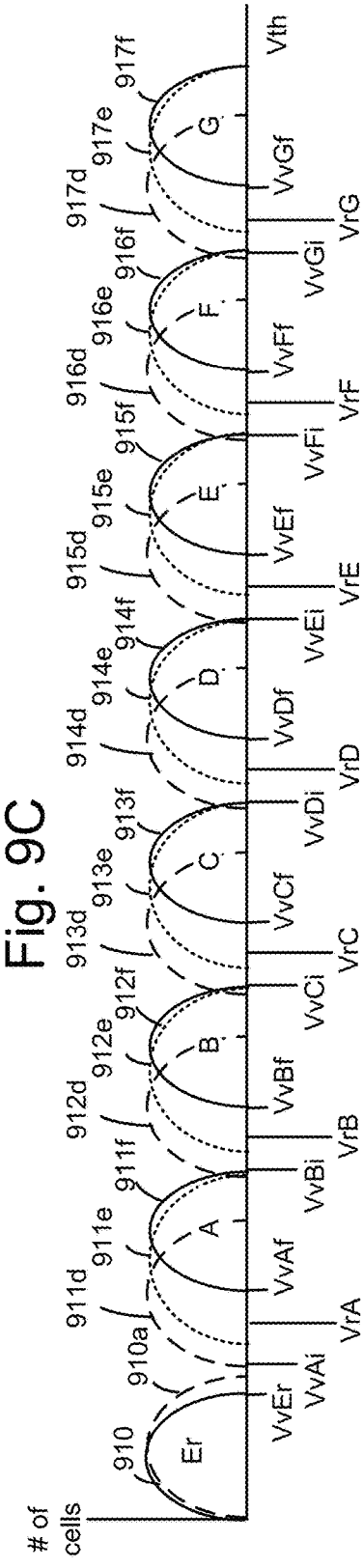
FIG. 9C depicts an example Vth distribution of a set of MLC memory cells in eight data states, where multi-pass programming is performed using initial and final verify voltages.

FIG. 9C depicts an example Vth distribution of a set of MLC memory cells in eight data states, where multi-pass programming is performed using initial and final verify voltages. A first program pass uses the initial verify voltages VvAi, VvBi, VvCi, VvDi, VvEi, VvFi and VvGi for the A, B, C, D, E, F and G states, respectively, to provide the Vth distributions 911d, 912d, 913d, 914d 915d, 916d and 917d, respectively.

Subsequently, after an adjacent word line is programmed, the Vth distributions are widened and shifted higher due to NWI as represented by the Vth distributions 911e, 912e, 913e, 914e, 915e, 916e and 917e for the A, B, C, D, E, F and G states, respectively. The adjacent word line and other word lines may be programmed in a single program pass, for example. Subsequently, after all or most other word lines are programmed, the second program pass uses the final verify voltages VvAf, VvBf, VvCf, VvDf, VvEf, VvFf and VvGf for the A, B, C, D, E, F and G states, respectively, to provide the Vth distributions 911f, 912f, 913f, 914f 915f, 916f and 917f, respectively. These final verify voltages may be the same as in FIG. 9A. The initial verify voltages can be different than, and may be lower than, the lower verify voltages of FIG. 9B, for instance. The second program pass increases the Vth further after it is upshifted due to NWI so that the final Vth can be set in a controlled manner after NWI occurs. The second program pass can be the final program pass for a block or sub-block, in one approach.

FIG. 9D depicts an example Vth distribution of a set of MLC memory cells in four data states, with and without NWI. Another countermeasure to NWI is to separate the Vth distributions of the data states by programming fewer bits per memory cell. By dividing the range of available threshold voltages into fewer data states, the distance between the Vth of adjacent data states can increase. As a result, a larger amount of Vth upshift due to NWI can be tolerated without a read error. For example, FIG. 9D uses four data states or two bits per memory cell and FIG. 9A uses eight data states or three bits per memory cell. The data states includes the Er states and three programmed states A, B and C.

At a start of a program operation, the memory cells are all initially in the erased state as represented by the Vth distribution 910b. After the program operation is success- fully completed, the memory cells assigned to the Er state are represented by the Vth distribution 910c due to program disturb.

The memory cells which are programmed to the A, B and C states are represented by the Vth distributions 911f, 912f and 913f, respectively, immediately after programming is completed, and before NWI.

After an adjacent word line is programmed, the Vth distributions are widened and shifted higher due to NWI as represented by the Vth distributions 911g, 912g and 913g for the A, B and C states, respectively. Read voltages VrA1, VrB1 and VrC1 can be used for reading the states of the memory cells in a read operation.

FIG. 9E depicts an example Vth distribution of a set of SLC memory cells in two data states, with and without NWI. This example uses two data states or one bit per memory cell. The data states includes the Er state and a programmed state A. At a start of a program operation, the memory cells are all initially in the erased state as represented by the Vth distribution 910h. After the program operation is success- fully completed, the memory cells assigned to the Er state are represented by the Vth distribution 910i due to program disturb.

The memory cells which are programmed to the A state are represented by the Vth distribution 911h immediately after programming is completed, and before NWI.

After an adjacent word line is programmed, the Vth distribution is widened and shifted higher due to NWI as represented by the Vth distribution 911i for the A state. A read voltage Vr2 is used for reading the states of the memory cells in a read operation.

In one approach, a control circuit is configured to store a first number of bits of data (e.g., 1 bit in FIG. 9E or 2 bits in FIG. 9D) into a first-programmed memory cell of a NAND string and to store a second number of bits (e.g., 3 bits in FIG. 9A), greater than the first number of bits, into other memory cells in the NAND string.

Figure 10A:
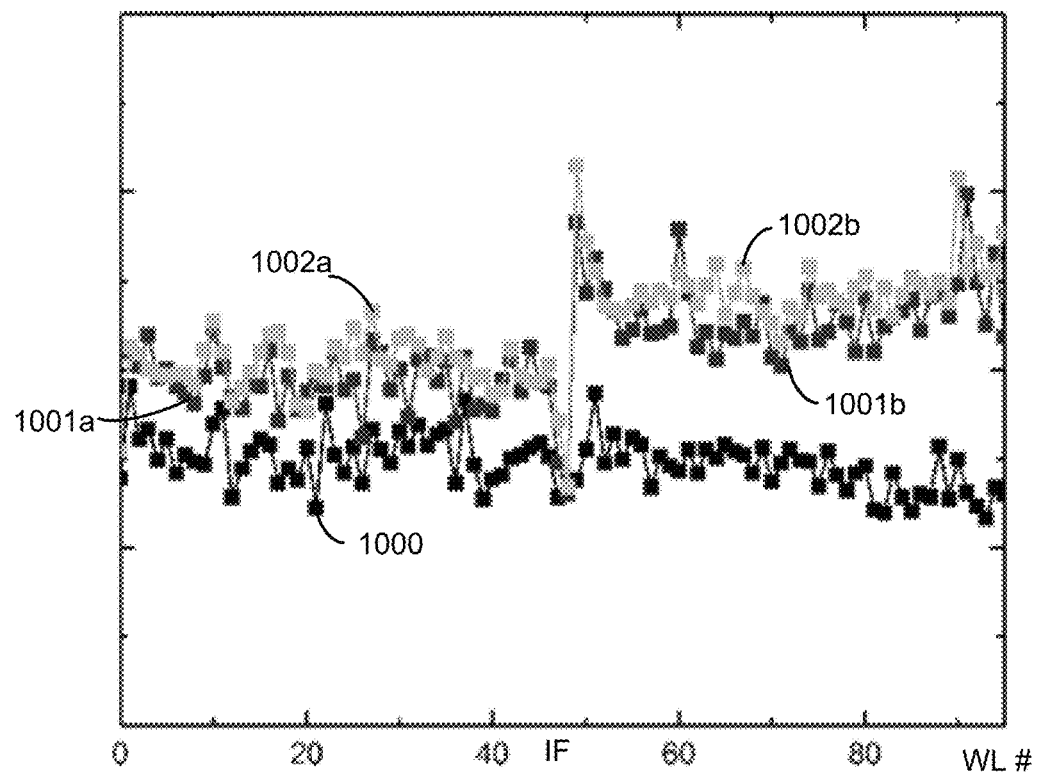
FIG. 10A depicts a plot of a Vth width versus a word line number with a downward programming order.

FIG. 10A depicts a plot of a Vth width versus a word line number with a downward programming order. The word line numbers of FIG. 10A-10F are consistent with FIG. 5-8, where a stack comprises 96 data word lines, and each NAND string comprises 96 corresponding data memory cells. FIG. 10A-10F shows the different levels of NWI which are seen using upward and downward programming orders. FIGS. 10A, 10C and 10E use a downward program- ming order, and FIGS. 10B, 10D and 10F use a downward programming order. An upward programming order refers to, e.g., programming one word line after another while proceeding in a direction toward the top of a block or stack, or otherwise toward the drain end of the NAND stings. A downward programming order refers to, e.g., programming one word line after another while proceeding in a direction toward the bottom of a block or stack, or otherwise toward the source end of the NAND stings. Note that programming a word line refers to programming the memory cells con- nected to the word line. The programming involves the data memory cells but not the dummy memory cells in the examples described herein.

Figure 10B:
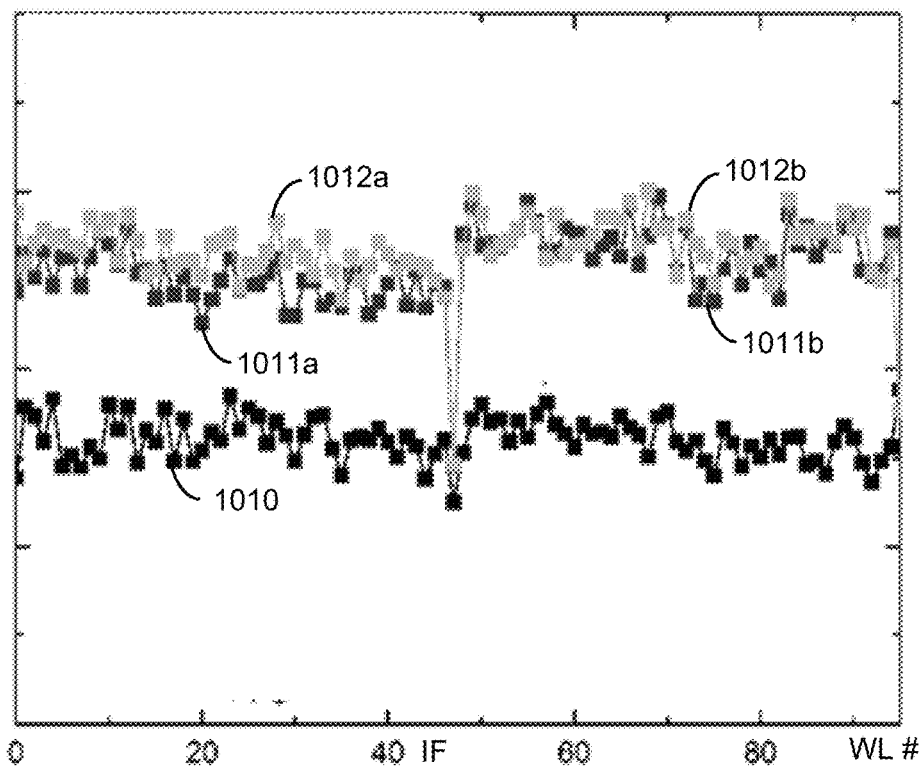
FIG. 10B depicts a plot of a Vth width versus a word line number with an upward programming order.
Figure 10E:
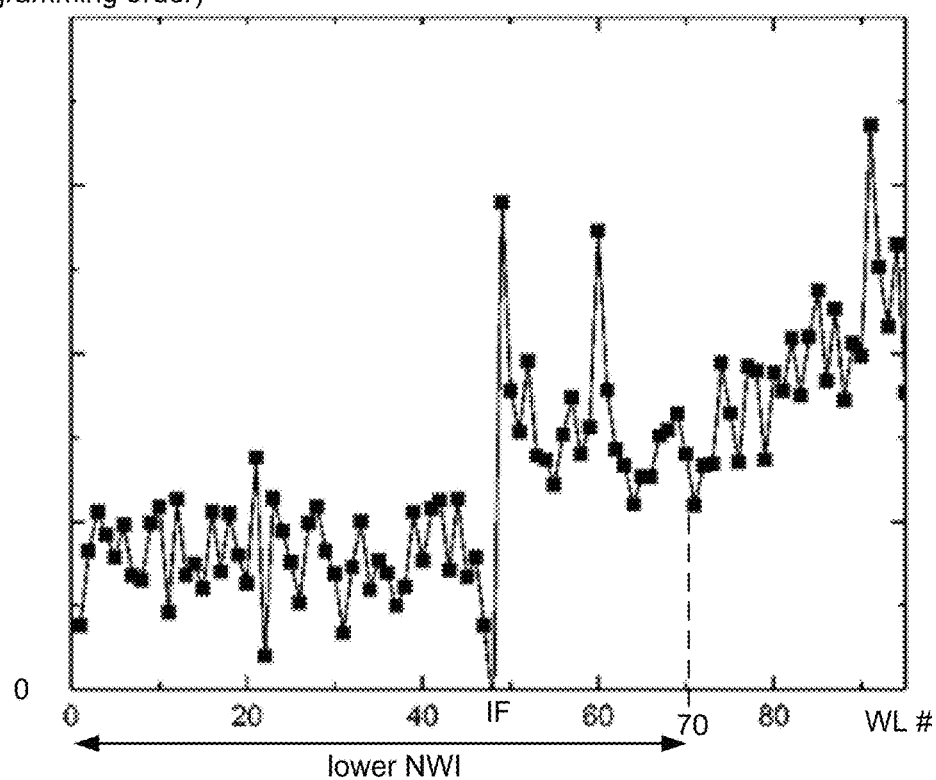
FIG. 10E depicts a plot of an increase in Vth width due to NWI versus a word line number with a downward programming order, consistent with FIG. 10A.

The range of voltages on the vertical axis is the same in FIGS. 10A and 10B and the data is to scale. The Vth values are for the A state, which is most susceptible to NWI. Tests were performed in which the memory cells of each of the word lines were programmed and the Vth measured. The word line number denotes the programmed word line and ranges from WL0 to WL95. WL0-WL47 are in the lower tier and WL48-WL95 are in the upper tier. A downward WL programming order is used. In this case, the topmost word line of the stack, e.g., WL95, is programmed first and the remaining word lines are programmed one at a time, e.g., WL94, WL93 and so on, concluding with the bottommost word line of the stack, WL0.

The plot 1000 represents the Vth width (the six-sigma width) after the word line is programmed and before an adjacent word line is programmed, so there is NWI. The plots 1001a and 1001b represent the Vth width when the programmed word line is in the lower or upper tier, respectively, and after a neighbor word line is programmed. In this case, NWI occurs so that the Vth width increases. The plots 1002a and 1002b represent the Vth width when the programmed word line is in the lower or upper tier, respectively, and after all remaining word lines have been programmed. Some additional disturb occurs so that the Vth width increases further.

The largest factor in the increase of the Vth width is NWI. Additionally, the NWI is significantly greater for a word line in the upper tier than the lower tier.

FIG. 10B depicts a plot of a Vth width versus a word line number with an upward programming order. In contrast to FIG. 10A, an upward WL programming order is used. In this case, the bottommost word line of the stack, e.g., WL0, is programmed first and the remaining word lines are programmed one at a time, e.g., WL1, WL2 and so on, concluding with the topmost word line of the stack, WL95. With the upward WL programming order, the increase in the Vth width due to NWI is about the same for the upper and lower tiers.

In particular, the plot 1010 represents the Vth width after the word line is programmed and before an adjacent word line is programmed, so there is NWI. The plots 1011a and 1011b represent the Vth width when the programmed word line is in the lower or upper tier, respectively, and after a neighbor word line is programmed. In this case, NWI occurs so that the Vth width increases. The plots 1012a and 1012b represent the Vth width when the programmed word line is in the lower or upper tier, respectively, and after all remaining word lines have been programmed. Some additional disturb occurs so that the Vth width increases further.

FIG. 10C depicts a plot of upper and lower tail Vth versus a word line number with a downward programming order, consistent with FIG. 10A. The range of voltages on the vertical axis is the same in FIGS. 10C and 10D and the data is to scale. As mentioned, NWI typically results in an upshift and widening of the Vth distribution of the affected memory cells. The plot 1020 represents the 3-sigma lower tail of the Vth distribution after the word line is programmed and before an adjacent word line is programmed, as well as after a neighbor word line is programmed. The plot 1021 represents the lower tail after all remaining word lines have been programmed. It can be seen that the disturb of the lower tail is due mainly to the programming of the remaining word lines and not to NWI. Additionally, the disturb increases for word lines which are closer to the top of the stack than to the bottom.

The plot 1022 represents the 3-sigma upper tail of the Vth distribution after the word line is programmed and before an adjacent word line is programmed, so that there is no NWI. The plot 1023 represents the upper tail after an adjacent word line is programmed, so that NWI occurs. The plot 1024 represents the upper tail after all remaining word lines have been programmed. For the upper tail, the NWI is significant, and is greater for word lines in the upper tier than those in the lower tier. The NWI is greater for the upper tail than the lower tail.

FIG. 10D depicts a plot of upper and lower tail Vth versus a word line number with an upward programming order, consistent with FIG. 10B. The plot 1030 represents the 3-sigma lower tail of the Vth distribution after the word line is programmed and before an adjacent word line is programmed, as well as after a neighbor word line is programmed. The plot 1031 represents the lower tail after all remaining word lines have been programmed. It can be seen that the disturb of the lower tail is due mainly to the programming of the remaining word lines and not to NWI. Additionally, the disturb increases for word lines which are closer to the bottom of the stack than to the bottom.

The plot 1032 represents the 3-sigma upper tail of the Vth distribution after the word line is programmed and before an adjacent word line is programmed, so that there is no NWI. The plot 1033 represents the upper tail after an adjacent word line is programmed, so that NWI occurs. The plot 1034 represents the upper tail after all remaining word lines have been programmed. For the upper tail, the NWI is significant, and is greater for word lines in the upper tier than those in the lower tier. The NWI is somewhat greater for the upper tail than the lower tail, although this difference is less pronounced than in FIG. 10C.

FIG. 10E depicts a plot of an increase in Vth width due to NWI versus a word line number with a downward programming order, consistent with FIG. 10A. The range of voltages on the vertical axis is the same in FIGS. 10E and 10F and the data is to scale. The plot is obtained by subtracting the plot 1000 from the plots 1001a and 1001b in FIG. 10A.

Figure 10F:
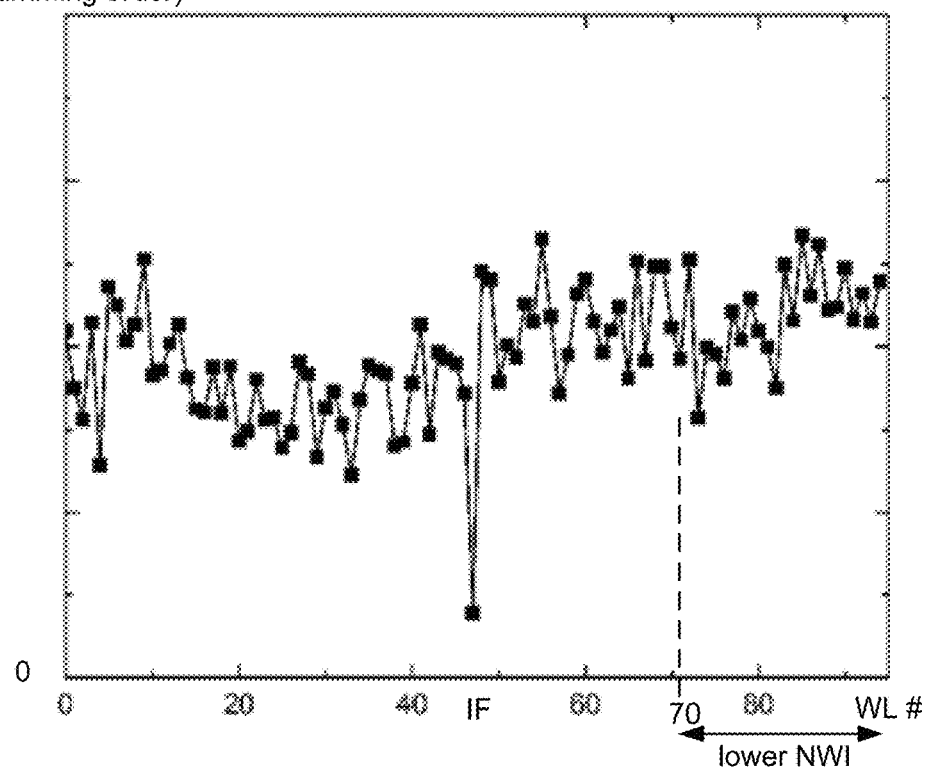
FIG. 10F depicts a plot of an increase in Vth width due to NWI versus a word line number with an upward programming order, consistent with FIG. 10B.

FIG. 10F depicts a plot of an increase in Vth width due to NWI versus a word line number with an upward programming order, consistent with FIG. 10B. The plot is obtained by subtracting the plot 1010 from the plots 1011a and 1011b in FIG. 10A. By observing the data of FIGS. 10E and 10F, it can be seen that the increase in Vth due to NWI is less when a downward programming order is used for word lines below and including a certain word line number, e.g., WL70, and the increase in Vth due to NWI is less when an upward programming order is used for word lines above the certain word line number. Moreover, this result is independent of whether the upward programming order is performed before or after the downward programming order. Various programming processes, including those of the flowcharts of FIG. 11A-11F, can be implemented based on these results.

FIG. 11A depicts a program process which reduces NWI in a multi-tier stack of memory cells. Step 1100 begins a program operation for a multi-tier stack (e.g., block or sub-block) of memory cells. For example, the stack may comprise a lower, bottom or first tier, and an upper, top or second tier which is above the lower tier. The stack could have more than two tiers as well. Step 1101 includes performing programming in a first word line programming order and step 1102 includes performing programming in a second word line programming order which is opposite the first word line programming order.

FIG. 11B depicts an example implementation of FIG. 11A in which an upward programming order is used for word lines in an upper tier and a downward programming order is used for word lines in a lower tier. FIGS. 10E and 10F demonstrate how NWI can be reduced by the downward programming order in the lower tier and an upward programming order in part of the upper tier. As a simplification, the upward programming order can be applied to the entire upper tier.

Step 1110 begins a program operation for a multi-tier stack. Step 1111 includes performing programming in an upward programming order for word lines in an upper tier, and step 1112 includes performing programming in a downward programming order for word lines in a lower tier. Step 1111 can occur before or after step 1112.

It can be advantageous to perform the downward programming order before the upward programming order because it is easier to pre-charge the channel in a pre-charge phase of the program operation, discussed in connection with FIG. 14D. In particular, the channel pre-charge occurs via the bit line at the drain end of the NAND strings. The memory cells above the first-programmed memory cell will all remain in the erased state while the downward programming order is followed, so that the channel portions adjacent to the erased state memory cells will have a relatively higher conductivity compared to the case where the memory cells are programmed. The pre-charge can therefore occur more easily.

A control circuit is configured to pre-charge a channel of the NAND string during the programming in the downward programming order.

FIG. 11C depicts an example implementation of FIG. 11A in which an upward programming order is used for a first group of word lines in an upper tier and a downward programming order is used for a second group of word lines in the upper tier and for the word lines in the lower tier. Step 1120 includes beginning a program operation for a multi-tier block comprising: (a) a first group of word lines above a second group of word lines in an upper tier, and (b) word lines in a lower tier. For example, see the first group 1202*a*, second group 1202*b* and lower tier set of word lines 1201 of FIG. 12C. The first group may be adjacent to and above the interface of the stack, and the second group may be adjacent to and below the top of the stack. The first group may also be adjacent to the second group.

Step 1121 includes performing programming in an upward programming order for the first group of word lines. For example, in FIG. 12C, this can involve programming WLx+1 up to WL96, one word line at a time. Step 1122 includes performing programming in a downward programming order for the second group of word lines and for the word lines in the lower tier. For example, in FIG. 12C, this can involve programming WLx down to WL48 and then WL47 down to WL0. Step 1121 can occur before or after step 1122.

When opposite programming orders are used, the first-programmed word line of the program operation for the stack is susceptible to a higher amount of NWI since it has two adjacent, later-programmed word lines. These are the word lines above and below the first-programmed word line. For example, in FIG. 12C, if WLx+1 is the first-programmed word lines as in the programming orders 1220 and 1221, WLx+1 will receive NWI from WLx+2 when WLx+2 is programmed during the upward programming order. WLx+1 will also receive NWI from WLx when WLx is programmed during the downward programming order. The remaining word lines have just one adjacent, later-programmed word line.

If WLx is the first-programmed word line, WLx will receive NWI from WLx−1 when WLx−1 is programmed during the downward programming order. WLx will also receive NWI from WLx+1 when WLx1 is programmed during the upward programming order. Accordingly, it can be desirable to provide an additional NWI countermeasure for the first-programmed word line. In this regard, step 1123 notes the option to program fewer bits per cell, perform multi-pass programming and/or use lower verify voltages for the first-programmed word line. The programming of fewer bits per cell can be achieved using the verify voltages of FIG. 9D or 9E instead of the verify voltages of FIG. 9A, for example. Multi-pass programming can be performed using the verify voltages of FIG. 9C, for example. Programming using lower verify voltages can be performed using the verify voltages of FIG. 9B, for example.

FIG. 11D depicts an example implementation of step 1123 of FIG. 11C in which step 1121 occurs before step 1122 and multi-pass programming is used for the first-programmed word line, WLx+1, consistent with FIG. 9C. A programming order is depicted. First, the bottommost word line of the first group of word lines (e.g., WLx+1 in FIG. 12C) is programmed in a first program pass. Second, the remaining word lines in the first group of word lines (e.g., WLx+2 to WL95 in FIG. 12C) are programmed in an upward programming order, in a single programming pass for each word line. Third, the word lines in the first group and the lower tier (e.g., collectively WLx to WL0 in FIG. 12C) are programmed in a downward programming order, in a single programming pass for each word line. Fourth, the bottommost word line of the first group of word lines (e.g., WLx+1 in FIG. 12C) is programmed in a second program pass.

FIG. 11E depicts an example implementation of step 1123 of FIG. 11C in which step 1122 occurs before step 1121 and multi-pass programming is used for the first-programmed word line, WLx, consistent with FIG. 9C. A programming order is depicted. First, the topmost word line of the second group of word lines (e.g., WLx in FIG. 12C) is programmed in a first program pass. Second, the remaining word lines in the second group of word lines and the word lines in the lower tier (e.g., collectively WLx−1 to WL0 in FIG. 12C) are programmed in a downward programming order, in a single programming pass for each word line. Third, the word lines in the first group (e.g., WLx+1 to WL95 in FIG. 12C) are programmed in an upward programming order, in a single programming pass for each word line. Fourth, the topmost word line of the second group of word lines (e.g., WLx in FIG. 12C) is programmed in a second program pass.

In FIGS. 11D and 11E, a control circuit is configured to program a first-programmed memory cell in multiple program passes, and to program other, remaining memory cells in the NAND string in a single program pass. The multiple program passes may comprise a first pass and a second pass, and at least one other memory cell in the NAND string is programmed after the first pass and before the second pass. In FIG. 11D, the memory cells of WLx+2 to WL95 and WLx to WL0 are programmed after the first pass and before the second pass of WLx+1. In FIG. 11E, the memory cells of WLx−1 to WL0 and WLx+1 to WL95 are programmed after the first pass and before the second pass of WLx.

FIG. 11F depicts an example programming operation for a selected word line, consistent with FIG. 11A. Step 1140 begins a program operation for a block. Step 1141 selects a word line to program. This can include setting latches for selected memory cells based on program data. For example, the latches may designate a data state which is assigned to a memory cell. If the data state is the erased state, the latches designate that the memory cell has a lockout status and should be inhibited from programming. If the data state is a programmed state, the latches designate that the memory cell has a program status and should be programmed. Step 1142 sets an initial program voltage. See also FIG. 14A. Step 1143 begins a program loop for WL_sel. Step 1144 includes performing a pre-charge phase. For example, see the pre-charge phase 1487 in FIG. 14D. This can involve applying a positive bit line voltage to the drain ends of each of the NAND strings and applying a turn-on voltage to the select gate transistors.

Step 1145 includes performing a program phase. For example, see the program phase 1488 in FIG. 14D. This can involve reading the latches of the selected memory cells, e.g., to determine whether the memory cells are in a lockout or program state, and applying a corresponding bit line voltage.

Step 1146 includes performing a verify phase. For example, see the verify phase 1489 in FIG. 14D. This can involve performing verify tests for the selected memory cells based on the assigned data state stored in their latches. Further, the latches can be updated based on the result of a verify test to indicate whether the verify test was passed. For example, the latches can be updated from the program state to the lockout state for memory cells which pass a verify test. A decision step 1147 determines if there is a next program loop. A next program loop may be performed if many memory cells have not completed programming. If this is true, step 1148 includes incrementing Vpgm, and a next program loop begins at step 1143. If decision step 1147 is false, the programming of the word line is completed, and a decision step 1149 determines if there is a next word line to program. If there is a next word line to program, the next word line is selected at step 1141. If there is no next word line to program, step 1150 denotes the end of the program operation for the block or stack.

Figure 12A:
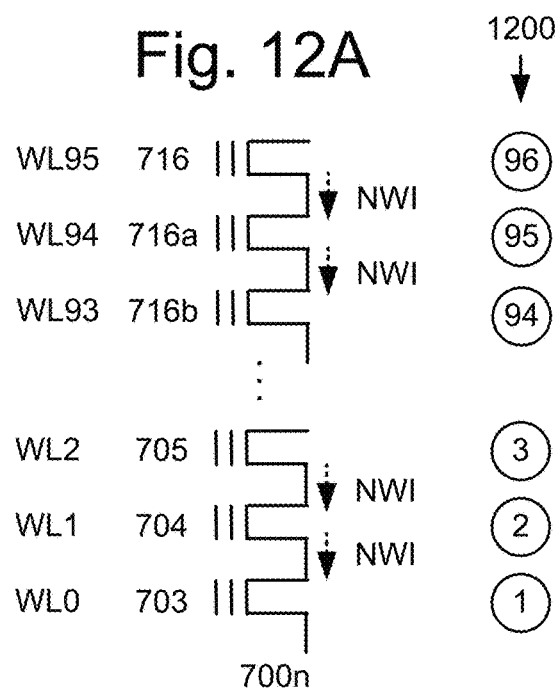
FIG. 12A depicts a NAND string where an upward programming order is used for the entire NAND string, as a comparative example.
Figure 12B:
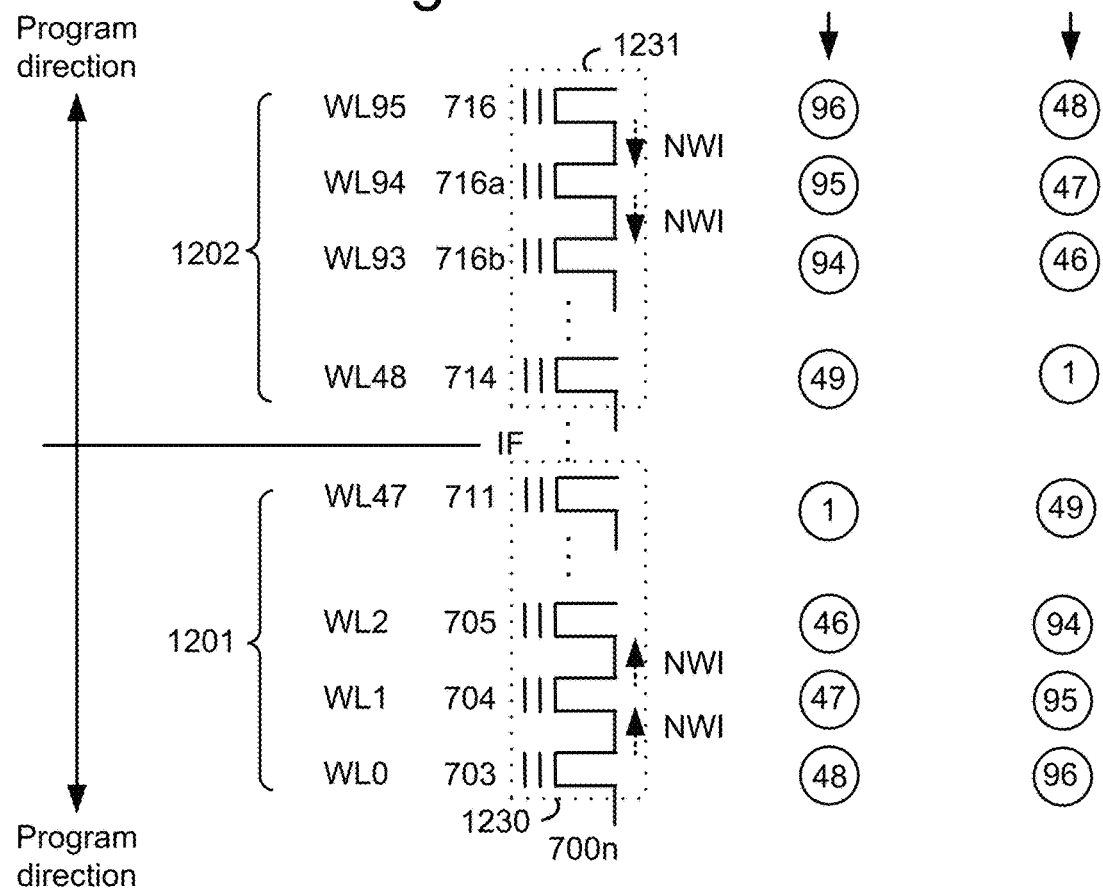
FIG. 12B depicts a NAND string where an upward programming order is used for memory cells in an upper tier and a downward programming order is used for memory cells in the lower tier, consistent with FIG. 11B.

FIG. 12A depicts a NAND string where an upward programming order is used for the entire NAND string, as a comparative example. The example NAND string 700n includes memory cells 703, 704, 705, 716b, 716a and 716 connected to WL0, WL1, WL2, WL93, WL94 and WL95, respectively. A programming order 1200 starts at WL0, the bottom or source-side word line of the stack, and proceeds to WL95, the top or drain side word line of the stack. In FIG. 12A to 12C, dashed line arrows denote NWI. Since the programming order is upward, each arrow points downward, indicating that the programming of a given word line or memory cell causes NWI to the adjacent previously-programmed word line or memory cell in the NAND string. In FIG. 12A to 12C, the circled numbers denote the programming order.

FIG. 12B depicts a NAND string where an upward programming order is used for memory cells in an upper tier and a downward programming order is used for memory cells in the lower tier, consistent with FIG. 11B. The example NAND string 700n includes a set of memory cells 1230 comprising memory cells 703, 704, 705, 711 connected to a set of word lines 1201 in a lower tier of a stack, and a set of memory cells 1231 comprising memory cells 714, 716b, 716a and 716 connected to a set of word lines 1202 in an upper tier of the stack. In addition to the memory cells and word lines depicted in FIG. 12A, memory cells 711 and 714 are connected to WL47 and WL48, respectively. These are the interface-adjacent data memory cells and word lines.

In this example, an upward program direction is used for the entire upper tier and a downward program direction is used for the entire lower tier.

A first example involves a down then up programming order 1210 in which WL47 is programmed first and programming proceeds in a downward direction to WL0 as the 48$^{th}$ programmed word line. WL48 through WL95 are then programmed in the upward direction as the 49$^{th}$ through 96$^{th}$ programmed word lines, respectively.

In the lower tier, since the programming order is downward, each arrow points upward, indicating that the programming of a given word line or memory cell causes NWI to the adjacent previously-programmed word line or memory cell in the NAND string. In the upper tier, since the programming order is upward, each arrow points downward, indicating that the programming of a given word line or memory cell causes NWI to the adjacent previously-programmed word line or memory cell in the NAND string.

A second example involves an up then down programming order 1211 in which WL48 is programmed first and programming proceeds in an upward direction to WL96 as the 48th programmed word line. WL47 through WL0 are then programmed in the downward direction as the 49$^{th}$ through 96$^{th}$ programmed word lines, respectively.

FIG. 12C depicts a NAND string where an upward programming order is used for a first group of memory cells 1240 in an upper tier of a stack and a downward programming order is used for a second group of memory cells 1242 in the upper tier of the stack and for a set of memory cells 1244 in a lower tier of the stack, consistent with FIG. 11C. The first group of memory cells 1240 is connected to a first group of word lines 1202a. The second group of memory cells 1242 is connected to a second group of word lines 1202b. The set of memory cells 1244 is connected to the set of word lines 1201.

The first group of memory cells is adjacent to the drain end 615 (FIG. 5) of the NAND string 700n and to a top 553 of the upper tier. The second group of memory cells is adjacent to a bottom 552 of the upper tier.

The example NAND string 700n includes memory cells 703, 704, 705 . . . , 711, 714 . . . , 715a, 715b, 715c, 715d, 715e, . . . 716b, 716a and 716 connected to word lines WL0, WL1, WL2 . . . , WL47, WL48 . . . , WLx-2, WLx-1, WLx, WLx+1, WLx+2 . . . , WL93, WL94 and WL95, respectively. The memory cells 703, 704, 705 . . . , 711 are in the lower tier set of word lines 1201. The memory cells 714 . . . , 715a, 715b, 715c are in the second group. The memory cells 715d, 715e, . . . 716b, 716a and 716 are in the first group.

The notation WLx represents an xth word lines, where x is a word line number which places the word line in the upper tier, with one or more data word lines below WLx in the upper tier, and one or more data word lines above WLx in the upper tier. In one approach, The value x can be set such that the first group of memory cells comprises at least 20% and no more than 80% of the memory cells in the upper tier. For example, with 48 memory cells in the upper tier, the value x can be set such that: (48+20%×48)≤x≤(48+80%×48) or (48+9)≤x≤(48+38), or 57≤x≤86.

The value x can be set to minimize the NWI based on plots such as shown in FIGS. 10E and 10F. In this example, x=70 is optimal. This means WL70 is the topmost word line in the second group of word lines, and the memory cell 715c is the topmost memory cell in the second group of memory cells. Also, WL71 is the bottommost word line in the first group of word lines, and the memory cell 715d is the bottommost memory cell in the first group of memory cells.

In this example, an upward program direction is used for one part of the upper tier and a downward program direction is used for another part of the upper tier and for the entire lower tier.

A first example involves an up then down programming order 1220 in which WLx+1 is programmed first and programming proceeds in an upward direction to WL95 as the (95-x)th programmed word line. The memory cell 715d is a first-programmed memory cell in this example. WLx through WL0 are then programmed in the downward direction as the (95-x+1)$^{th}$ through 96$^{th}$ word lines, respectively. This assumes there are 96 data word lines.

In the groups of word lines 1201 and 1202*b*, since the programming order is downward, each arrow points upward, indicating that the programming of a given word line or memory cell causes NWI to the adjacent, higher previously-programmed word line or memory cell in the NAND string. In the group of word lines 1202*a*, since the programming order is upward, each arrow points downward, indicating that the programming of a given word line or memory cell causes NWI to the adjacent, lower previously-programmed word line or memory cell in the NAND string.

A second example, represented by the programming order 1221, is consistent with the first example for the case where x=70. WL71 is programmed first and programming proceeds in an upward direction to WL95 as the 25th programmed word line. WL70 through WL0 are then programmed in the downward direction as the 26th through 96th programmed word lines, respectively.

A third example involves a down then up programming order 1222 in which WLx is programmed first and programming proceeds in a downward direction to WL0 as the $(x+1)^{th}$ programmed word line. The memory cell 715*c* is a first-programmed memory cell in this example. WLx+1 through WL95 are then programmed in the upward direction as the $(x+2)^{th}$ through 96th word lines, respectively.

A fourth example, represented by the programming order 1223, is consistent with the third example for the case where x=70. WL70 is programmed first and programming proceeds in a downward direction to WL0 as the $71^{st}$ programmed word line. WL71 through WL95 are then programmed in the upward direction as the $72^{nd}$ through $96^{th}$ word lines, respectively.

Various options are possible. For example, one programming order can include: program the group of word lines 1202*a* upwardly, then the group of word lines 1201 downwardly and then the group of word lines 1202*b* down. Another programming order can include: program the group of word lines 1201 upwardly, then the group of word lines 1202*b* downwardly and then the group of word lines 1202*a* upwardly.

Note that in the programming orders 1222 and 1223, the memory cell 715*c* connected to WLx is subject to NWI from both adjacent memory cells 715*b* and 715*d* since both adjacent memory cells are programmed after the memory cell 715*c* is programmed. This explains why additional NWI countermeasures for the memory cell 715*c* are warranted, such as reducing a number of bits per memory cell, programming in multiple passes and/or programming using lower verify voltages, or providing a greater height for WLx+1 or one or both dielectric layers adjacent to WLx+1. Similarly, in the programming orders 1220 and 1221, the memory cell 715*d* connected to WLx+1 is subject to NWI from both adjacent memory cells 715*c* and 715*e* so that additional NWI countermeasures for the memory cell 715*d* are warranted.

In one approach, an upward word line programming order is used for a top portion of the top tier (comprising the group of word lines 1202*a*), and a downward word line programming order is used for a bottom portion of the top tier (comprising the group of word lines 1202*b*) and for the bottom tier (comprising the group of word lines 1201).

Figure 13A:
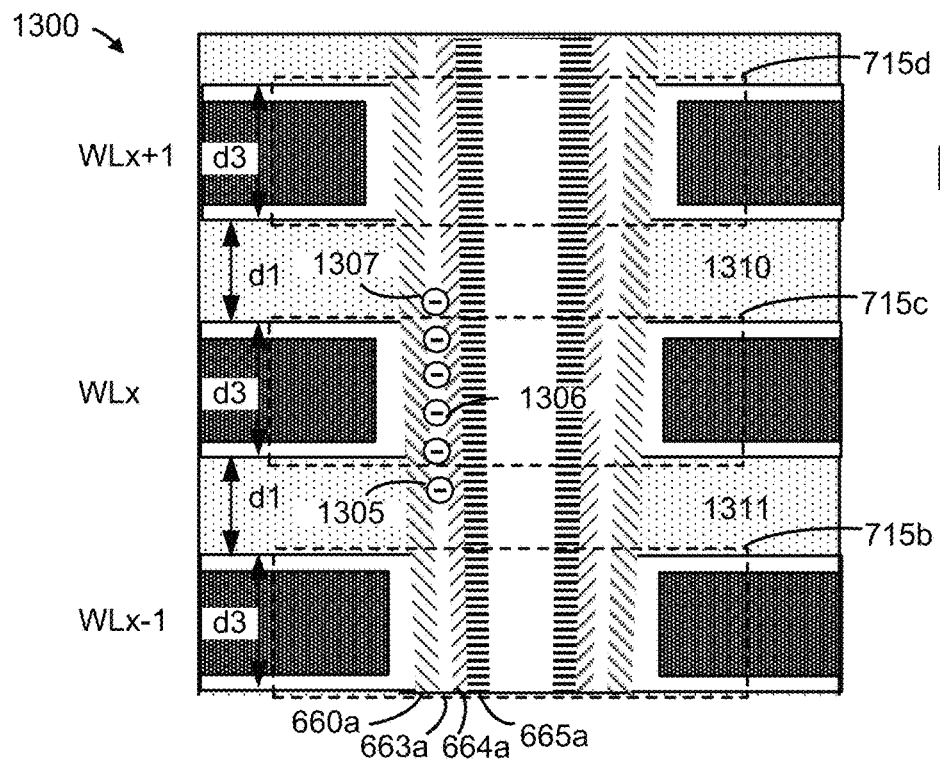
FIG. 13A depicts an example portion 1300 of the stack 610 of FIG. 5, including electrons in a charge trapping layer of a NAND string consistent with the programming order 1222 of FIG. 12C, after WLx is programmed.

FIG. 13A depicts an example portion 1300 of the stack 610 of FIG. 5, including electrons in a charge trapping layer of a NAND string 700*n* consistent with the programming order 1222 of FIG. 12C, after WLx is programmed. Memory cells 715*b*, 715*c* and 715*d* are connected to WLx−1, WLx and WLx+1, respectively. Each word line or memory cell has the same height or thickness d3. This is also the control gate length of the memory cells. The dielectric layers between the memory cells and word lines also have the same height or thickness d1, except for the dielectric in the interface. A dielectric region 1310 is between WLx and WLx+1 and a dielectric region 1311 is between WLx and WLx−1.

During programming, electrons (depicted by circles with a dash) are injected from the channel into the charge trapping layer 663*a*. Most of the electrons (including an example electron 1306) are injected into a region of the charge-trapping layer within the memory cell 715*c*, adjacent to WLx. However, due to a fringing electric field, some electrons (including an example electron 1305) are injected into a region of the charge-trapping layer below the memory cell 715*c* and WLx, and some electrons (including an example electron 1307) are injected into a region of the charge-trapping layer above the memory cell 715*c* and WLx.

Next, the memory cell 715*b* connected to WLx−1 is programmed, as discussed in connection with FIG. 13B

Figure 13B:
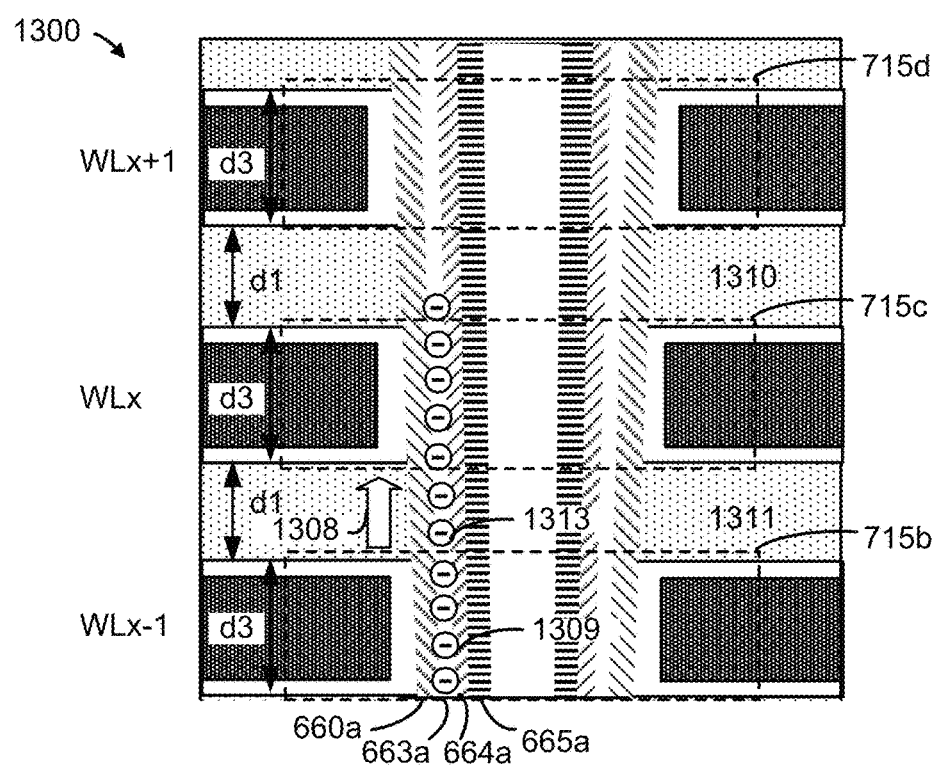
FIG. 13B depicts the example portion 1300 of the stack 610 of FIG. 5, including electrons in the charge trapping layer of the NAND string after WLx−1 is programmed.

FIG. 13B depicts the example portion 1300 of the stack 610 of FIG. 5, including electrons in the charge trapping layer of the NAND string after WLx−1 is programmed. During programming, electrons are injected from the channel into the charge trapping layer 663*a*. Most of the electrons (including an example electron 1309) are injected into a region of the charge-trapping layer within the memory cell 715*b*, adjacent to WLx−1. However, due to a fringing electric field, some electrons (including an example electron 1313) are injected into a region of the charge-trapping layer above the memory cell 715*b* and WLx−1. Some electrons are also injected into a region of the charge-trapping layer below the memory cell 715*b* and WLx−1.

The programming of the memory cell 715*b* creates an electric field 1308 which tends to move electrons closer to the memory cell 715*c*, causing NWI.

Next, the memory cells of WLx−2 through WL0 are programmed in a downward sequence. Then the memory cell 715*d* of WLx+1 is programmed at the start of the upward programming order, as discussed in connection with FIG. 13C.

Figure 13C:
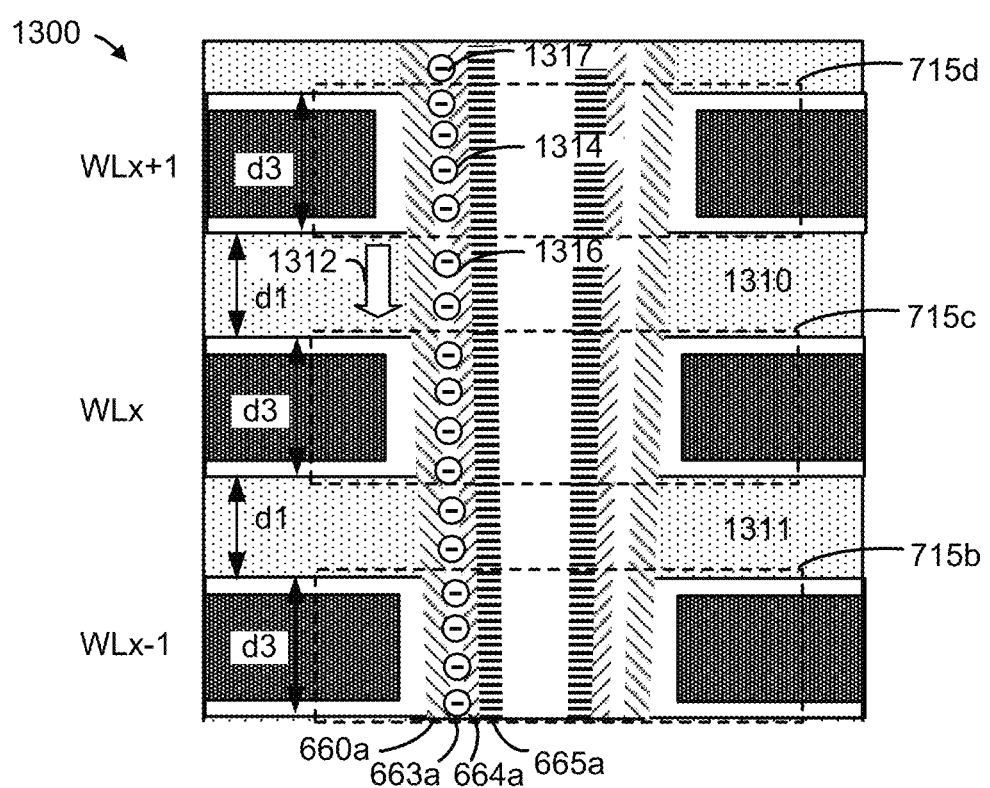
FIG. 13C depicts the example portion 1300 of the stack 610 of FIG. 5, including electrons in a charge trapping layer of the NAND string after WLx+1 is programmed.

FIG. 13C depicts the example portion 1300 of the stack 610 of FIG. 5, including electrons in a charge trapping layer of the NAND string after WLx+1 is programmed. During programming, electrons are injected from the channel into the charge trapping layer 663*a*. Most of the electrons (including an example electron 1314) are injected into a region of the charge-trapping layer within the memory cell 715*d*, adjacent to WLx+1. However, due to a fringing electric field, some electrons (including an example electron 1317) are injected into a region of the charge-trapping layer above the memory cell 715*d* and WLx+1. Some electrons (including an example electron 1316) are also injected into a region of the charge-trapping layer below the memory cell 715*d* and WLx+1.

The programming of the memory cell 715*d* creates an electric field 1312 which tends to move electrons closer to the memory cell 715*c*, causing additional NWI.

Next, the upward sequence is completed with the programming of the memory cells of WLx+2 through WL95.

Figure 13D:
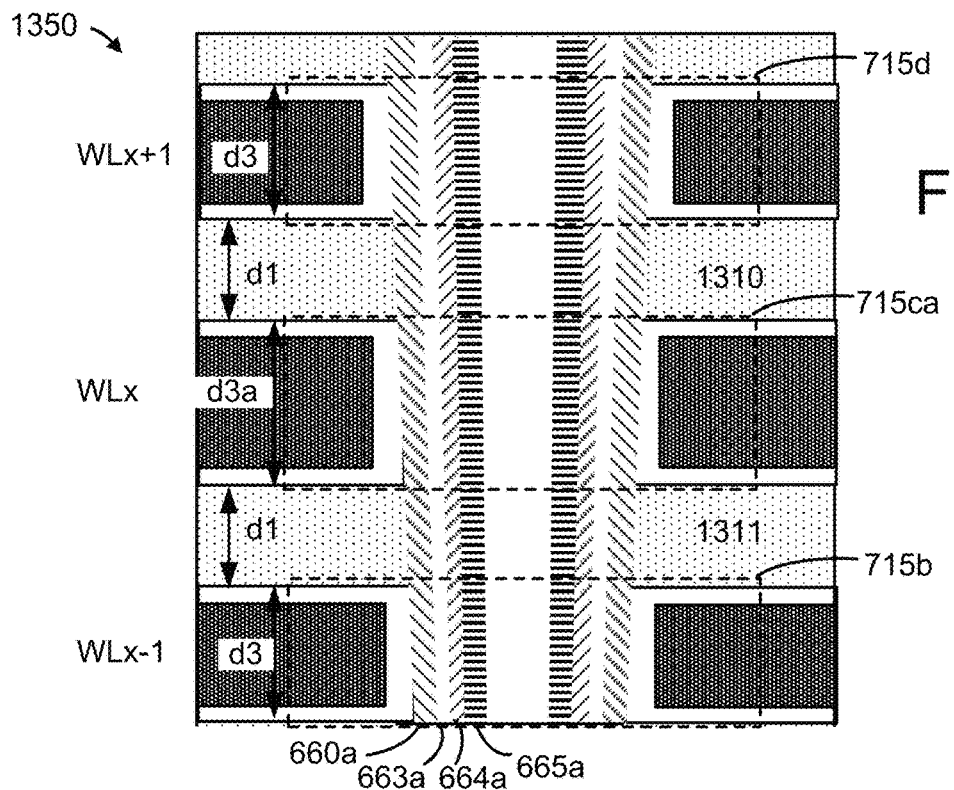
FIG. 13D depicts an example portion 1350 of the stack 610 of FIG. 5, where a height d3a of WLx is greater than the height d3 of other word lines.

FIG. 13D depicts an example portion 1350 of the stack 610 of FIG. 5, where a height d3*a* of WLx is greater than the height d3 of other word lines. As mentioned, one possible NWI countermeasure involves increasing the height or thickness of WLx from d3 to d3*a*. For example, this could be 10-100% greater than d3. This results in a memory cell 715*ca* with a longer control gate length. The memory cell 715*ca* will be more resistant to NWI since it will have more electrons in its longer charge trapping layer than the other memory cells. The electrons which migrate into the memory cell from the neighboring memory cells will form a smaller portion of the total number of electrons so that the NWI (Vth upshift) will be smaller. The thicker word line layer can be formed by modifying the fabrication process of FIG. 15 to deposit more sacrificial material in the control gate layer which becomes WLx.

In one approach, a control gate length d3a of a first-programmed memory cell (e.g., memory cell 715c in the programming orders 1222 or 1223 in FIG. 12C, or memory cell 715d in the programming orders 1220 or 1221) of the NAND string is longer than control gate lengths d3 of other, remaining memory cells in the NAND string.

Figure 13E:
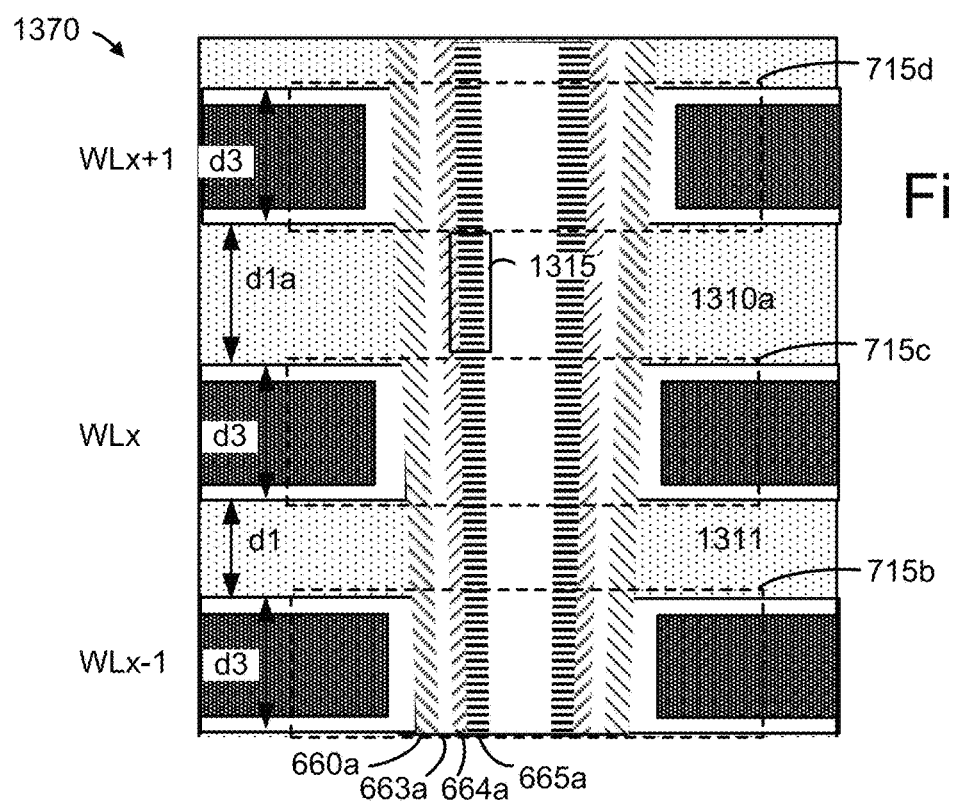
FIG. 13E depicts an example portion 1370 of the stack 610 of FIG. 5, where a height d1a of a dielectric region 1310a between WLx and WLx+1 is greater than the height d1 of other dielectric regions.

FIG. 13E depicts an example portion 1370 of the stack 610 of FIG. 5, where a height d1a of a dielectric region 1310a between WLx and WLx+1 is greater than the height d1 of other dielectric regions. As mentioned, another possible NWI countermeasure involves increasing the height or thickness of one or both dielectric layers adjacent to WLx from d1 to d1a. For example, this could be 10-100% greater than d1. The memory cell 715c will be more resistant to NWI since fewer electrons from the adjacent memory cells will reach the memory cell due to the increased inter-cell distance. The memory cell 715d will also be more resistant to NWI.

The thicker dielectric layer can be formed by modifying the fabrication process of FIG. 15 to deposit more material in the dielectric layers adjacent to (and above and/or below) WLx. It is also possible to combine the countermeasures of FIGS. 13D and 13E.

In one approach, the memory cells of the upper tier are separated by dielectric regions, and a height d1a of a dielectric region 1310a adjacent to a first-programmed memory cell (e.g., 715c, 715d) of the NAND string is greater than heights d1 of dielectric regions (e.g., 1311) adjacent to other, remaining memory cells in the upper tier.

The dielectric region 1310a should not be too thick or it will be difficult to turn on the channel during program and read operations. One option is to dope a region 1315 of the channel layer 665a which is adjacent to the dielectric region 1310a to make it more conductive. For example, an n-type dopant such as Arsenic or Phosphorus can be provided in the region 1315. If such doping is used, the NAND string can still be erased by introducing holes through both ends of the NAND strings since the doping could block the movement of holes in the channel. The doping can be performed by modification of the fabrication process.

In one aspect, a NAND string comprises a channel which extends from a top of the NAND string to the bottom of the NAND string, and a doping concentration of a portion of the channel in the dielectric region adjacent to a first-programmed memory cell is greater than a doping concentration of other, remaining portions of the channel.

FIG. 14A depicts a voltage signal used in a series of program loops in an example program operation for MLC memory cells consistent with FIG. 11F. The horizontal axis denotes a program loop number, and the vertical axis denotes voltage. During a program operation, program loops are performed for a selected word line in a selected block. A program loop comprises a program portion in which a program voltage or pulse is applied to the selected word line followed by a verify portion in which a verify signal is applied to the selected word line while one or more verify tests, referred to as program-verify tests, are performed for the associated memory cells. Other than the erased state, each assigned state has a verify voltage which is used in the verify test for the state in a program operation.

The voltage signal 1400 includes a series of program voltages, including an initial program voltage 1401, Vpgm_init, which are applied to a word line selected for programming. In this example, the voltage signal includes program voltages which increase stepwise in amplitude in one or more program loops of a program pass using a fixed or varying step size. This is referred to as incremental step pulse programming, where the program voltage starts at an initial voltage, Vpgm_init, and increases in a step in each successive program loop, for instance, until the program operation is completed. The operation is successfully completed when the threshold voltages of the selected memory cells reach the verify voltages of the assigned data states.

A program operation can include a single program pass or multiple program passes, where each pass uses incremental step pulse programming, for instance.

The verify signal in each program loop, including example verify signal 1402, can include one or more verify voltages, based on the assigned data states which are being verified for the program loop. The verify tests can encompass lower assigned data states and then midrange assigned data states and then higher assigned data states as the program operations proceeds. The example verify signals depict three verify voltages as a simplification. See also FIG. 14B and the verify phase of FIG. 14D.

All memory cells may initially be in the erased state at the beginning of the program operation, for instance. After the program operation is completed, the data can be read from the memory cells using read voltages which are between the Vth distributions. At the same time, a read pass voltage, Vread (e.g., 8-10 V), also referred to as pass voltage or turn-on voltage, is applied to the remaining (unselected) word lines. By testing whether the Vth of a given memory cell is above or below one or more of the read reference voltages, the system can determine the data state which is represented by a memory cell. These voltages are demarcation voltages because they demarcate between Vth ranges of different data states.

Moreover, the data which is programmed or read can be arranged in pages. For example, with four data states, or two bits per cell, two pages of data can be stored. An example encoding of bits for the Er, A, B and C states is 11, 10, 00 and 01, respectively, in the format of upper page (UP) bit/lower page (LP) bit. A lower page read may use VrA and VrC and an upper page read may use VrB.

With eight data states, or three bits per cell, three pages of data can be stored. An example encoding of bits for the A, B, C, D, E, F and G states is 111, 110, 100, 000, 010, 011, 001 and 101, respectively. The data of the lower page can be determined by reading the memory cells using read voltages of VrA and VrE. The data of the middle page can be determined by reading the memory cells using read voltages of VrB, VrD and VrF. The data of the upper page can be determined by reading the memory cells using read voltages of VrC and VrG.

Figure 14B:
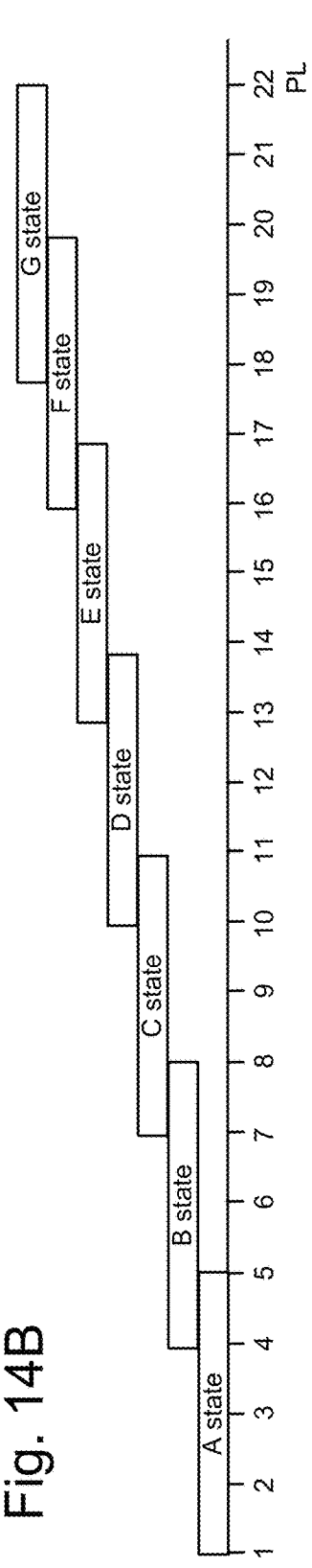
FIG. 14B depicts an example of the verification of different data states in the different program loops of FIG. 14A.

FIG. 14B depicts an example of the verification of different data states in the different program loops of FIG. 14A. To reduce programming time, verify operations can be performed for the lower, mid-range and higher data states during the lower, mid-range and higher program loops, respectively. The bars denote which data states are verified in which program loops, and are time-aligned with the program loop axis of FIG. 14A. The bars overlap in some program loops, indicating that verify operations can be performed for multiple data states in a program loop. The bars indicate that verify operations for the A, B, C, D, E, F and G state are performed in program loops 1-5, 4-8, 7-11, 10-14, 13-17, 16-20 and 18-22, respectively.

Figure 14C:
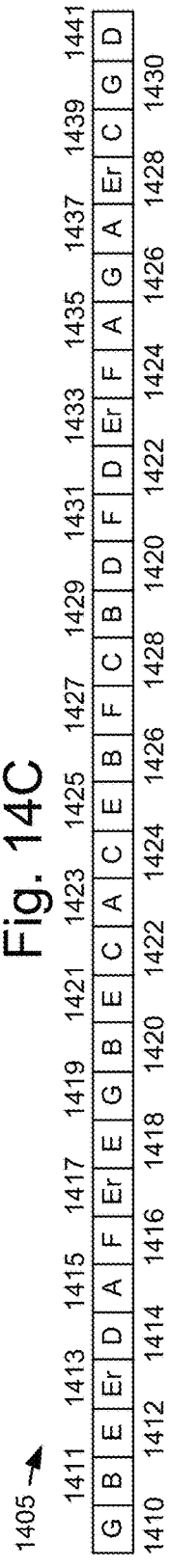
FIG. 14C depicts an example set 1405 of memory cells 1410-1441 connected to a word line selected for programming, consistent with step 1141 of FIG. 11F.

FIG. 14C depicts an example set 1405 of memory cells 1410-1441 connected to a word line selected for programming, consistent with step 1141 of FIG. 11F. This simplified example includes 32 memory cells, with 4 memory cells of each of 8 data states. Each memory cell is represented by a square and the assigned data state (Er-G) is represented by a letter inside the square. The set 1405 may represent a plurality of memory cells connected to a word line. The plurality of memory cells are configured to store data in a plurality of data states Er-G. For example, the A-state memory cells include memory cells 1415, 1423, 1435 and 1437. Note that a memory cell which is assigned to a data state is configured to store data of the data state.

FIG. 14D depicts examples of voltage signals which can be used in a program loop of a program operation, consistent with steps 1144-1146 of FIG. 11F. The vertical dimension denotes voltage and the horizontal dimension denotes time, with time points t0-t11. The period of time depicted corresponds to one program loop and includes a pre-charge phase 1487 (t0-t3), a program phase 1488 (t3-t9) and a verify phase 1489 (t9-t11). A voltage signal 1450 represents VWL_sel, the voltage of the selected word line, a voltage signal 1460 represents VWL_unsel, a voltage of unselected word lines, a voltage signal 1470 represent the select gate voltages, e.g., Vsgd and/or Vsgs, and a voltage signal 1480 represents Vbl, a bit line voltage. VWL_sel is at an initial voltage such as 0 V during the pre-charge phase. VWL_sel then increases from the initial voltage to an intermediate value, e.g., Vpass, starting at t3, and is held at Vpass until t5. VWL_sel then increases from Vpass to Vpgm starting at t5, and is held at Vpgm until t6. VWL_sel then decreases from Vpgm back to the initial voltage starting at t6 and is held at the initial voltage until t9. During the verify phase, VWL_sel increases in steps to one or more verify voltages. For example, VWL_sel may increase to VvE at t9, from VvE to VvF at t10, and from VvF back to the initial voltage at t11. These verify voltages are consistent with FIG. 14B at PL16 as an example.

The voltage signal 1470 represents the select gate voltages including the select gate voltage Vsg_sel for a selected sub-block (plot 1471) and the select gate voltage Vsg_unsel for an unselected sub-block (plot 1472). A selected sub-block comprises selected memory cells and an unselected sub-block comprises only unselected memory cells.

The voltage signal 1480 represents the bit line voltages including the voltage Vbl_sel for selected bit lines (plot 1481) and the voltage Vbl_unsel for unselected bit lines (plot 1482). A selected bit line is connected to a selected NAND string (comprising a selected memory cell connected to the selected word line) and an unselected bit line is connected to an unselected NAND string (comprising an unselected memory cell connected to the selected word line).

In the pre-charge phase, a positive Vbl, e.g., 2 V, is provided to the drain-side of the channels of the NAND strings to remove residue electrons in the channel and to provide a small amount of boosting such as 1-2 V. The SGD transistors of the selected and unselected sub-blocks are in a conductive state at this time, with a voltage of 6 V, for example. This allows the bit line voltage to be passed to the drain end of the channel. The SGS transistors of the selected and unselected sub-blocks may also be in a conductive state at this time, with a voltage of 6 V, for example, to allow the source line voltage (Vsl) to be passed to the source end of the channel.

In the program phase, VWL_sel and VWL_unsel are ramped up at t3 to provide the associated memory cells in a conductive state and to provide a capacitive coupling up of the associated channel regions of the unselected NAND strings. VWL_sel is then ramped up further at t5 to the peak program voltage of Vpgm and held at Vpgm until t6 to provide a strong gate-to-channel voltage for the selected memory cells which programs them.

In the verify phase, one or more verify tests are performed by applying one or more control gate read voltages on WL_sel, for each read voltage, sensing the conductive state of the memory cells in the selected NAND strings of the selected sub-block. VWL_unsel may be the same in the verify phase as the program phase, in one approach. This voltage is referred to as Vread in the verify phase and Vpass in the program phase.

During the program and verify phases, Vsg_sel can be set to, e.g., 2.5 V and 0 V, respectively, for the selected sub-block (plot 1471) and the unselected sub-blocks (plot 1472). During the program pulse, with Vbl_sel=0 V (plot 1481), Vsg_sel is high enough to provide the SG_sel transistors in a conductive state for the selected NAND strings. However, it is low enough that the SG_sel transistors can be provided in a non-conductive state for the unselected NAND strings, by setting a high Vbl for those strings. During the program and verify phases, Vbl_unsel can remain high at 2 V for the unselected NAND strings. Vbl_sel can be increased during the verify phase as part of a sensing process in which the bit lines are charged up. Vbl_unsel can also be increased in some cases.

During the verify phase, the SGD transistor is in a strongly conductive state to allow sensing to occur for the selected memory cell. Thus, the drain end select gate transistor is in a conductive state during the pre-charge phase and the program phase, for the selected NAND strings. Vsg_unsel is decreased to a turn-off voltage such as 0 V which provides the SG_unsel transistors in a non-conductive or off state for the NAND strings in the unselected sub-blocks. After the verify phase, at t11, Vbl is decreased to 0 V so that the SGD transistors are cutoff and the channel region has a floating voltage.

Figure 15:
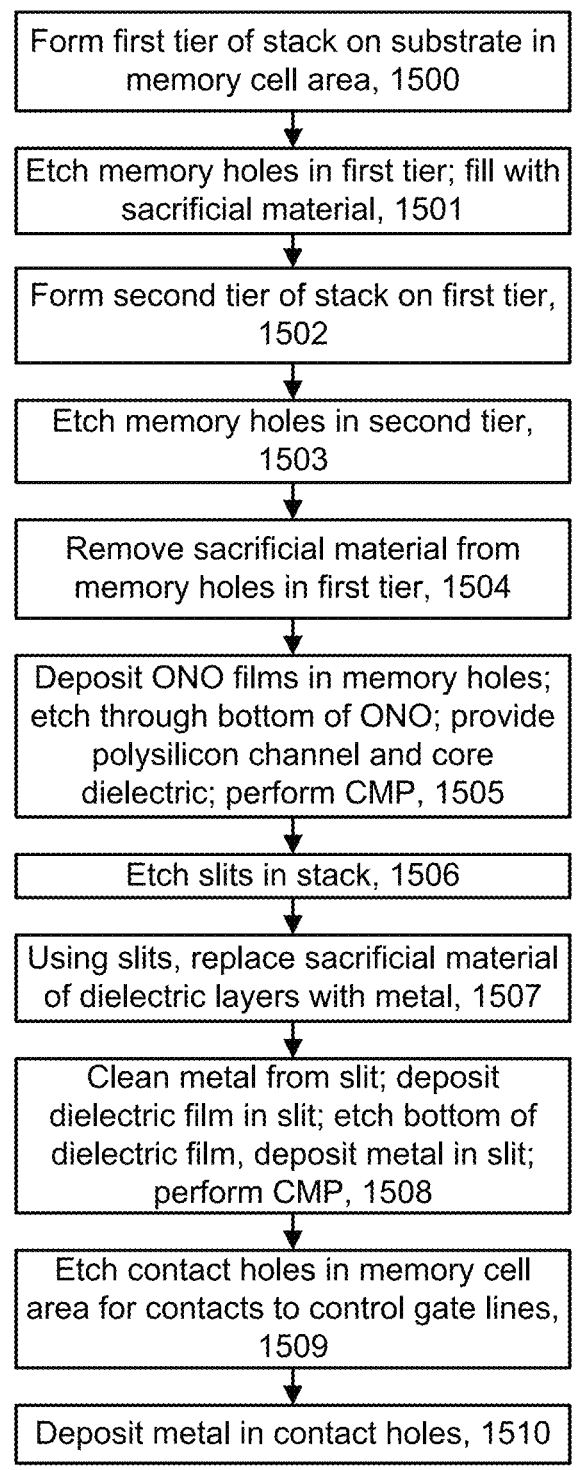
FIG. 15 depicts an example fabrication process for a semiconductor stack comprising two tiers, consistent with FIG. 5-8.

FIG. 15 depicts an example fabrication process for a semiconductor stack comprising two tiers, consistent with FIG. 5-8. The process can be extended to form more than two tiers. Step 1500 includes forming a lower tier of a stack on a substrate in a memory cell area. Step 1501 includes etching memory holes in the lower tier, and filling the memory holes with a sacrificial material, such as SiN. See, e.g., FIG. 16A.

Step 1502 includes forming an upper tier of the stack on the lower tier. Step 1503 includes etching memory holes in the upper tier. See, e.g., FIG. 16B. Step 1504 includes removing the sacrificial material from the memory holes in the lower tier, e.g., using a wet etch. See, e.g., FIG. 16C.

Step 1505 includes depositing oxide-nitride oxide (ONO) films in the memory holes. See, e.g., FIG. 16D. Step 1506 includes etching slits in the stack. See, e.g., FIG. 16E. Step 1507 includes using the slits to replace the sacrificial material of the dielectric layers of the stack with metal. This can involve providing an etchant via the slit which removes the sacrificial material, creating voids, then providing metal via the slit which fills the voids.

Step 1508 includes cleaning metal from the slit, depositing a dielectric film in the slit which coat the walls of the slit, etching a bottom of the dielectric film, depositing metal in the slit, and performing CMP to remove excess metal. This step can provide a conductive metal path in the slit from a top of the stack to the substrate, to connect to circuitry below the stack. See, e.g., FIG. 16F.

Step 1509 includes etching contact holes in the memory cell area for contacts to the control gate lines. See, e.g., FIG. 16G. Step 1510 includes depositing metal in the contact holes. See, e.g., FIG. 16G.

Note that some of the steps can be performed in a different order than the order shown in FIG. 15.

FIG. 16A depicts a semiconductor structure 1600 in a configuration which is consistent with steps 1500 and 1501 of FIG. 15. The structure includes a memory cell area of a substrate 1601. A peripheral area, not shown, may also be fabricated at the same time. The substrate comprises an intrinsic silicon region 1602, a deep n-well 1603 and a p-well 1604, for instance. A lower tier 1605 of a stack includes alternating dielectric layers and control gate layers. The control gate layers may comprise a sacrificial material at this stage of the fabrication. An example dielectric layer 1606 and an example control gate layer 1607 are depicted. This example includes nine control gate layers in the tier. A dielectric layer 1608 extends on top of the stack while a dielectric layer 1609 extends on top of the semiconductor structure. The dielectric layer 1608 may be, e.g., SiOx deposited by LPCVD or PECVD, for instance. The dielectric layer 1609 may be, e.g., SiN deposited by low pressure chemical vapor deposition (LPCVD) or plasma-enhanced chemical vapor deposition (PECVD), for instance.

The semiconductor structure includes a plurality of memory holes which are etched in the tier. An example memory hole 1610 (also referred to as a column or pillar when the memory hole is filled) includes a widened top portion 1611 above an elongated portion 1612. A source side region 1613 is below the memory hole. A top 1614 and a bottom 1615 of the stack are also depicted. A coordinate system shows x, y and z (vertical) directions.

FIG. 16B depicts a semiconductor structure 1620 in a configuration which is consistent with steps 1502 and 1503 of FIG. 15. A second (top) tier 1616 of the stack is formed on the lower tier and also includes alternating dielectric layers and control gate layers. An interface IF at the top of the lower tier separates the top and bottom tiers. An example dielectric layer 1621 and an example control gate layer 1622 are depicted. This example includes nine control gate layers in the tier. A dielectric layer 1623 extends on top of the semiconductor structure 1620 which comprises a stack 1626 of alternating dielectric layers and control gate layers.

Memory holes, including an example memory hole 1624 are etched in the upper tier of the stack. These memory holes are aligned with the sacrificial material in the memory holes in the lower tier (e.g., example sacrificial material 1625). In some cases there is a misalignment between the memory holes in the top and bottom tiers. The widened top portion 1611 provides an increased area for the memory hole in the top tier to contact, to ensure that the memory holes are connected to provide a continuous memory hole through both tiers.

Figure 16C:
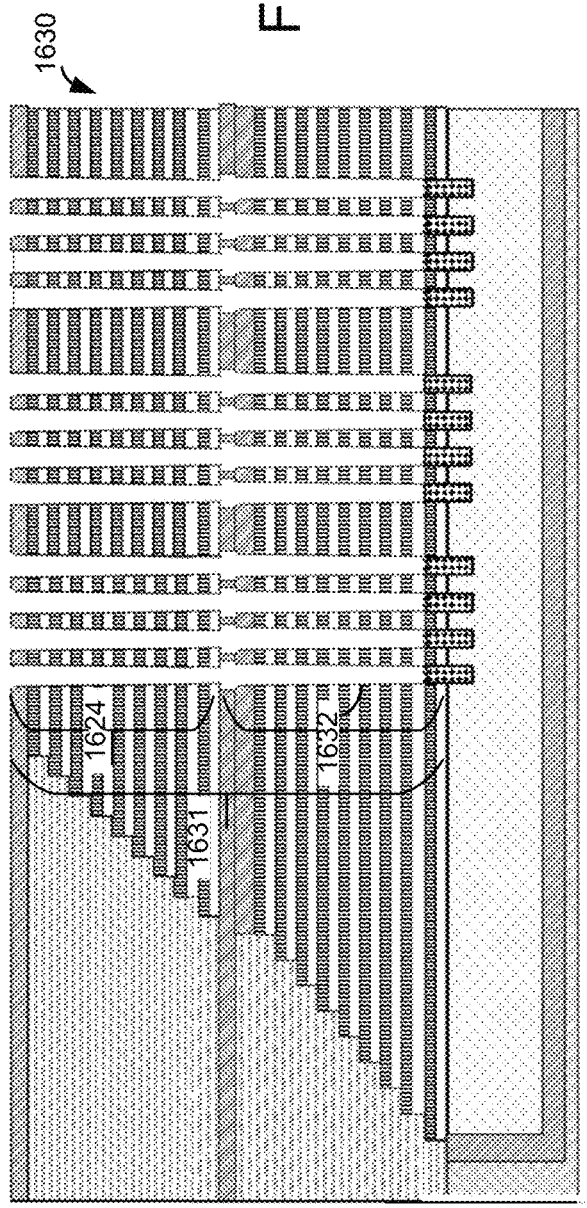
FIG. 16C depicts a semiconductor structure in a configuration which is consistent with step 1504 of FIG. 15.

FIG. 16C depicts a semiconductor structure 1630 in a configuration which is consistent with step 1504 of FIG. 15. Once the sacrificial material in the lower tier is removed, continuous memory holes, such as an example continuous memory hole 1631, are formed which extend through both tiers, from the top of the stack to the bottom of the stack. The continuous memory hole 1631 comprises the memory hole portion 1632 of the lower tier and the memory hole portion 1624 of the upper tier.

Figure 16D:
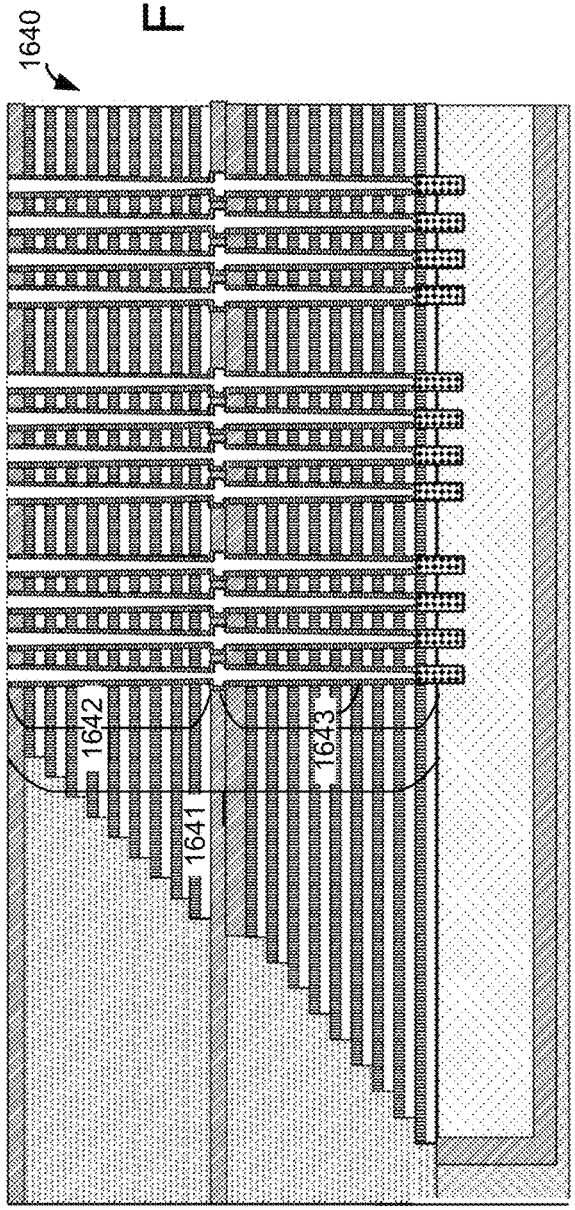
FIG. 16D depicts a semiconductor structure in a configuration which is consistent with step 1505 of FIG. 15.

FIG. 16D depicts a semiconductor structure 1640 in a configuration which is consistent with step 1505 of FIG. 15. The memory holes are filled with materials such as ONO films, a polysilicon channel and a core dielectric. To provide the polysilicon channel, amorphous silicon may be deposited follow by a heating step. This results in a column 1641 (e.g., pillar) comprising a column 1642 in the upper tier above a column 1643 in the lower tier.

Figure 16E:
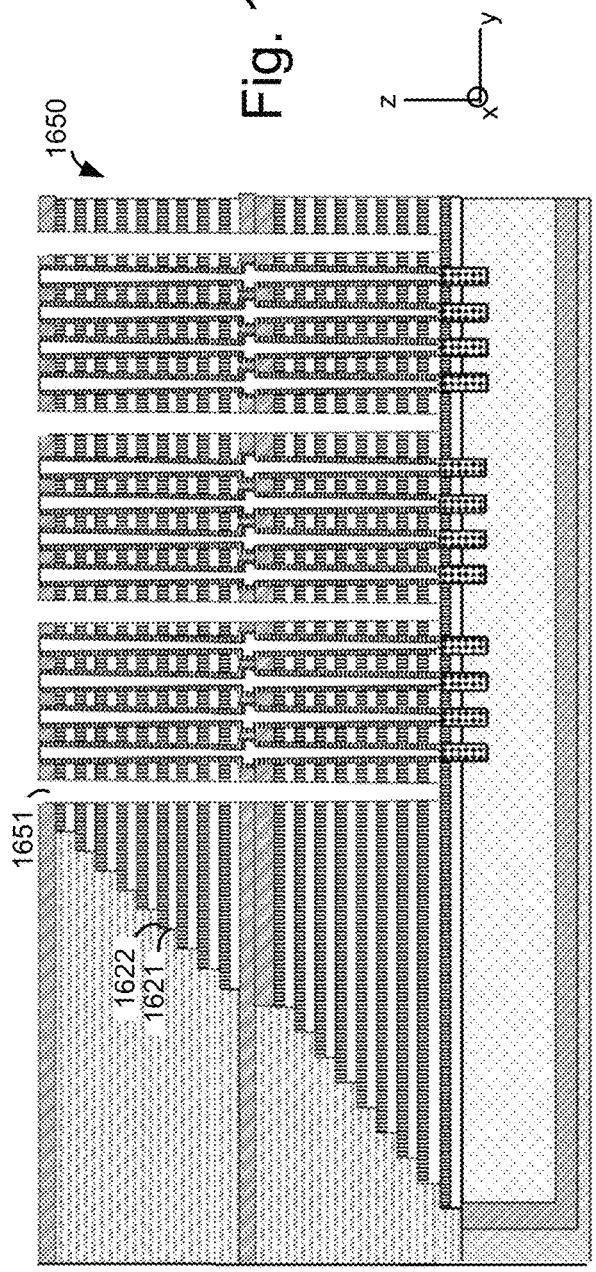
FIG. 16E depicts a semiconductor structure in a configuration which is consistent with step 1506 of FIG. 15.

FIG. 16E depicts a semiconductor structure 1650 in a configuration which is consistent with step 1506 of FIG. 15. Slits, including an example slit 1651, are formed periodically in the y direction in the stack. Each slit may have a uniform cross-section in the y-z plane and extend across the stack in the x direction.

Figure 16F:
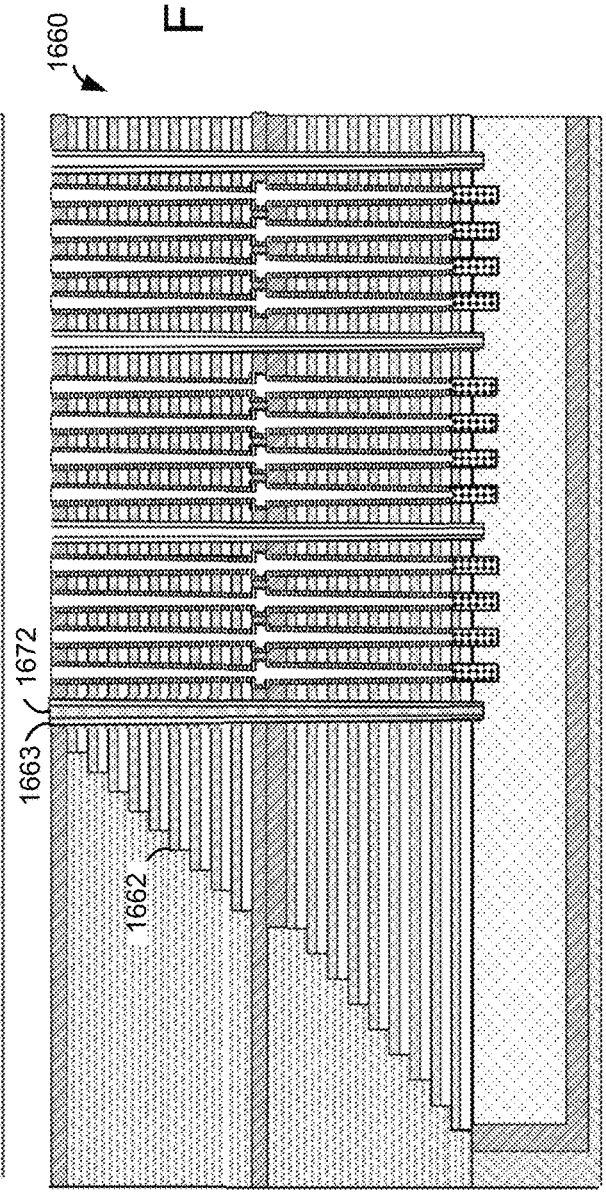
FIG. 16F depicts a semiconductor structure in a configuration which is consistent with steps 1507 and 1508 of FIG. 15.

FIG. 16F depicts a semiconductor structure 1660 in a configuration which is consistent with steps 1507 and 1508 of FIG. 15. By providing an etchant in the slits, the sacrificial material of the control gate layers is removed. Voids created in the control gate layers are subsequently filled with a metal such as tungsten. For example, a metal (e.g., conductive layer) is provided for the control gate layer 1622. A metal residual is then removed from the slits and a dielectric film 1663 is deposited in the slits, leaving a void in the slit. The void may extend from the p-well at a bottom of the stack to the top of the stack. The slit may be filled with a metal 1672 which provides a metal interconnect to the substrate.

Figure 16G:
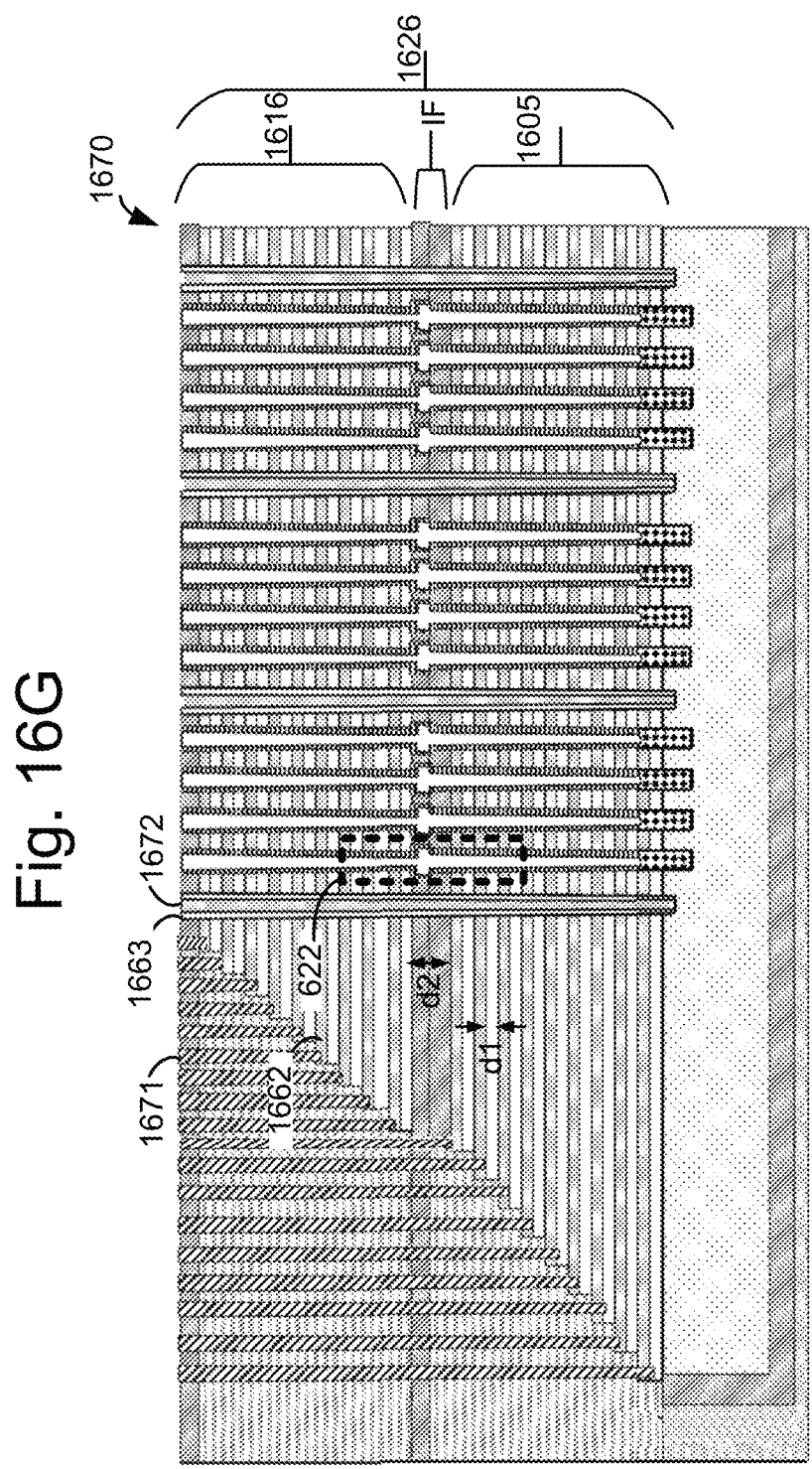
FIG. 16G depicts a semiconductor structure in a configuration which is consistent with steps 1509 and 1510 of FIG. 15.

FIG. 16G depicts a semiconductor structure 1670 in a configuration which is consistent with steps 1509 and 1510 of FIG. 15. Contacts holes are etched in the stack outside the area with the memory holes to provide voids which extend upward from terraced edges of control gate layers to the top of the stack. The contact holes are then filled with metal to provide metal vias which connect the control gate layers to the top of the stack. Subsequent processing involves connected metal paths above the stack to the contacts. The metal paths may in turn be connected to voltage sources, for example, or other circuitry. An example via 1671 is connected to the control gate layer 1662. The distances d1 and d2 between memory cells, discussed previously, are also depicted. See FIG. 6 for a close-up view of the region 622 of the stack.

The semiconductor structure is an example of a three-dimensional structure in which memory cells are arranged in NAND strings.

The stack comprises a plurality of alternating conductive and dielectric layers. The conductive layers are connected to control gates of memory cells and other transistors such as SGD and SGS transistors in each NAND string. In one approach, the conductive layers and associated memory cells in the top and bottom tiers are separate by a distance d1. The conductive layers and associated memory cells which are adjacent to the interface may be separate from one another by a larger distance d2.

In one implementation, an apparatus comprises: a NAND string extending in a lower tier and an upper tier of a stack, the lower tier separated from the upper tier by an interface, an inter-memory cell spacing in the NAND string is greatest at the interface, the NAND string comprising memory cells in the lower tier and memory cells in the upper tier, the NAND string comprising a drain end at a top of the stack and a source end at a bottom of the stack; and a control circuit configured to program the memory cells in the lower tier in a downward programming order and to program a first group of memory cells in the upper tier in a upward programming order.

In another implementation, a method comprises programming a first group of memory cells in a NAND string in an upper tier of a stack according to an upward programming order; programming a second group of memory cells in the NAND string in a lower tier of the stack according to a downward programming order, the second group of memory cells is below the first group of memory cells; and programming memory cells in a lower tier of the stack in the downward programming order.

In another implementation, an apparatus comprises: a NAND string extending in a first tier and a second tier of a stack, the second tier is above the first tier, the NAND string comprising memory cells in the first tier, a first group of memory in the second tier, and a second group of memory cells in the second tier, below the first group; an interface between the first tier and the second tier, an inter-memory cell spacing in the NAND string is greatest at the interface; and a control circuit configured to program the memory cells in the first tier and the second group in a downward programming order, starting from the second group and proceeding to the first tier, and to program the memory cells in the first group in an upward programming order.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
a plurality of alternating conductive layers and dielectric layers in a stack, the dielectric layers have respective heights, the stack comprising a lower tier, an upper tier, and an interface region separating the lower tier from the upper tier;
a NAND string extending in the lower tier, the interface region and the upper tier, the NAND string comprising memory cells in the lower tier and memory cells in the upper tier, the conductive layers comprise a set of word lines including word lines connected to the memory cells in the lower tier and word lines connected to the memory cells in the upper tier, the interface region comprises a dielectric material which extends from a top word line of the lower tier to a bottom word line of the upper tier, the dielectric material has a height which is at least 1.5 times the respective heights of the dielectric layers; and
a control circuit configured to program the memory cells in the lower tier in a downward programming order, to program a first group of memory cells in the upper tier in a upward programming order, and to program a second group of memory cells in the upper tier in the downward programming order, the second group of memory cells is below the first group of memory cells.

2. The apparatus of claim 1, wherein:
the control circuit is configured to perform the downward programming order for the second group of memory cells and then for the memory cells in the lower tier before performing the upward programming order for the first group of memory cells.

3. The apparatus of claim 2, wherein:
the first group of memory cells are in an erased state during the downward programming order; and the control circuit is configured to pre-charge a channel of the NAND string from a drain end of the NAND string during the downward programming order.

4. The apparatus of claim 1, wherein:
the first group of memory cells comprises at least 20% and no more than 80% of the memory cells in the upper tier.

5. The apparatus of claim 1, wherein:
a control gate length of a first-programmed memory cell of the NAND string is longer than control gate lengths of other memory cells in the NAND string.

6. The apparatus of claim 1, wherein:
a height of one of the dielectric layers which is adjacent to a first-programmed memory cell of the NAND string is greater than heights of dielectric layers adjacent to other memory cells in the NAND string.

7. The apparatus of claim 6, wherein:
the one of the dielectric layers is more conductive than the dielectric layers adjacent to the other memory cells in the NAND string.

8. The apparatus of claim 1, wherein:
the control circuit is configured to store a first number of bits of data into a first-programmed memory cell of the NAND string and to store a second number of bits, greater than the first number of bits, into other memory cells in the NAND string.

9. The apparatus of claim 1, wherein:
a verify voltage used for a first-programmed word line of the stack is lower than a verify voltage used for other word lines of the stack, for at least one data state.

10. The apparatus of claim 1, wherein:
the control circuit is configured to program a first-programmed memory cell of the NAND string in multiple program passes, and to program other memory cells in the NAND string in a single program pass.

11. The apparatus of claim 10, wherein:
the multiple program passes comprise a first pass and a second pass; and
at least one other memory cell in the NAND string is programmed after the first pass and before the second pass.

12. The apparatus of claim 1, wherein:
the NAND string extends in a memory hole;
a diameter of the memory hole at the top word line of the lower tier is greater than a diameter of the memory hole at the bottom word line of the upper tier; and
a widest region of the memory hole is in the interface region and has a diameter which is greater than the diameter of the memory hole at the top word line of the lower tier.

13. A method, comprising:
programming a first group of data memory cells in a NAND string in an upper tier of a stack according to an upward programming order;
programming a second group of data memory cells in the NAND string in the upper tier of the stack according to a downward programming order, the second group of data memory cells is below the first group of data memory cells; and
programming each data memory cell in a lower tier of the stack in the downward programming order, wherein the lower tier is separated from the upper tier by an interface region, a memory cell in the NAND string at a top of the lower tier adjacent to the interface region is a dummy memory cell, and a memory cell in the NAND string at a bottom of the upper tier adjacent to the interface region is a dummy memory cell.

14. The method of claim 13, wherein:

the programming of the first group of data memory cells occurs before the programming of the second group of data memory cells and the data memory cells in the lower tier of the stack.

15. The method of claim 13, wherein:

the programming of the second group of data memory cells and the data memory cells in the lower tier of the stack occurs before the programming of the first group of data memory cells;

a topmost data memory cell of the second group of data memory cells is programmed in multiple program passes; and other data memory cells in the NAND string are programmed in a single program pass.

16. The method of claim 13, wherein:

memory cells in the first group of data memory cells, the second group of data memory cells and the lower tier are spaced apart from one another by dielectric layers;

the dielectric layers have respective heights;

the interface region comprises a dielectric material which extends from the top of the lower tier to the bottom of the upper tier; and the dielectric material has a height which is at least 1.5 times the respective heights of the dielectric layers.

17. The method of claim 13, further comprising:

during the programming of the first group of memory cells, driving voltages on the dummy memory cells separately from driving voltages on unselected data memory cells in the NAND string.

18. An apparatus, comprising:

a NAND string extending in a first tier and a second tier of a stack, the second tier is above the first tier, the NAND string comprising a set of memory cells including memory cells in the first tier, a first group of memory cells in the second tier, and a second group of memory cells in the second tier, below the first group;

dielectric layers in the stack between the memory cells of the set of memory cells, the dielectric layers have respective heights;

an interface between the first tier and the second tier, the interface comprises a dielectric material which extends from a top of the first tier to a bottom of the second tier, a height of the dielectric material is at least 1.5 times the respective heights of the dielectric layers; and a control circuit configured to program the memory cells in the first tier and the second group in a downward programming order, starting from the second group and proceeding to the first tier, and to program the memory cells in the first group in an upward programming order.

19. The apparatus of claim 18, wherein:

the control circuit is configured to store a first number of bits of data into a bottommost memory cell of the first group of memory cells and to store a second number of bits, greater than the first number of bits, into other memory cells in the NAND string.

20. The apparatus of claim 18, wherein:

the control circuit is configured to store a first number of bits of data into a topmost memory cell of the second group of memory cells, and to store a second number of bits, greater than the first number of bits, into other memory cells in the NAND string.

* * * * *